United States Patent [19]

Shigehara et al.

[11] Patent Number: 5,321,326
[45] Date of Patent: Jun. 14, 1994

[54] OUTPUT BUFFER CIRCUIT

[75] Inventors: Hiroshi Shigehara, Tokyo; Masanori Kinugasa, Yokohama, both of Japan

[73] Assignee: Kabushiki Kaisha Toshiba, Kawasaki, Japan

[21] Appl. No.: 875,655

[22] Filed: Apr. 29, 1992

[30] Foreign Application Priority Data

Apr. 30, 1991 [JP] Japan .................................. 3-099318

[51] Int. Cl.⁵ .......................................... H03K 17/687
[52] U.S. Cl. .................... 307/572; 307/443; 307/584; 307/542
[58] Field of Search ............... 307/443, 475, 584, 585, 307/542, 572

[56] References Cited

U.S. PATENT DOCUMENTS

| | | | |
|---|---|---|---|
| 4,678,943 | 7/1987 | Uragami et al. | 307/473 |
| 4,731,553 | 3/1988 | Van Lehn et al. | 307/443 |
| 4,806,794 | 2/1989 | Walters, Jr. | 307/451 |
| 4,820,942 | 4/1989 | Chan | 307/542 |
| 4,829,199 | 5/1989 | Prater | 307/443 |
| 4,928,023 | 5/1990 | Marshall | 307/443 |
| 5,028,818 | 7/1991 | Go Ang et al. | 307/443 |
| 5,057,711 | 10/1991 | Lee et al. | 307/443 |
| 5,063,308 | 11/1991 | Borkar | 307/443 |
| 5,166,555 | 11/1992 | Kano | 307/443 |

FOREIGN PATENT DOCUMENTS 0212584 8/1986 European Pat. Off. .
2-70120 3/1990 Japan .
2239997 1/1991 United Kingdom .

OTHER PUBLICATIONS

Vol. 31 No. 5 Oct. 1988 IBM Technical Disclosure Bulletin, pp. 331-332.

*Primary Examiner*—William L. Sikes
*Assistant Examiner*—Toan Tran
*Attorney, Agent, or Firm*—Banner, Birch, McKie & Beckett

[57] ABSTRACT

An output buffer circuit includes a first output buffer having a high output resistance determined by DC specifications, a second output buffer having an output resistance satisfying AC specifications when simultaneously driven with the first output buffer, and a control circuit for controlling an operation of the second output buffer. An input signal is supplied to the input node of the first output buffer, and the output node of the first output buffer is connected to an output terminal. The output node of the second output buffer is connected to the output terminal. The control circuit is responsive to the potential of the input signal or of the output terminal to control the operation of the second output buffer. The control circuit drives the second output buffer when the output from the first output buffer is changed, and sets the output from the second output buffer in the high impedance state when the output from the first output buffer is stationary.

26 Claims, 28 Drawing Sheets

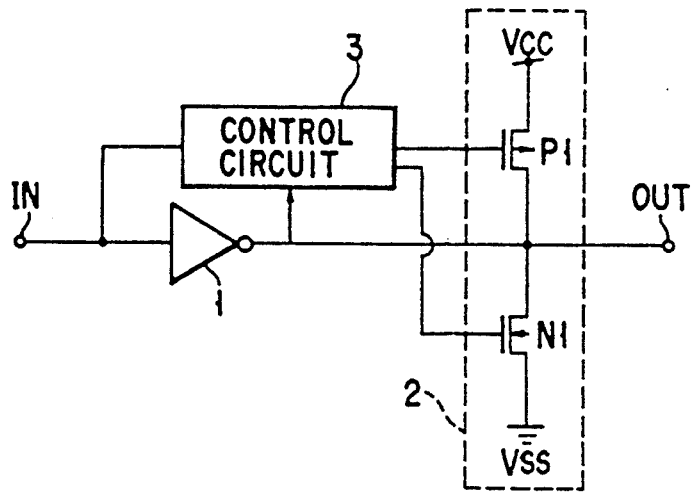
FIG. 1
FIG. 2(A)
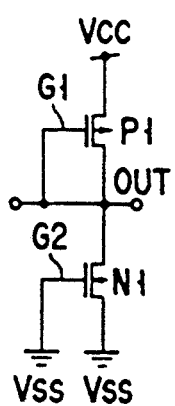
FIG. 2(B)
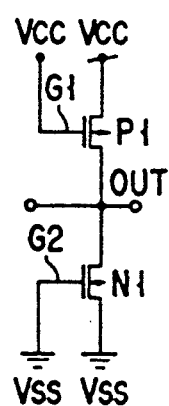
FIG. 2(C)
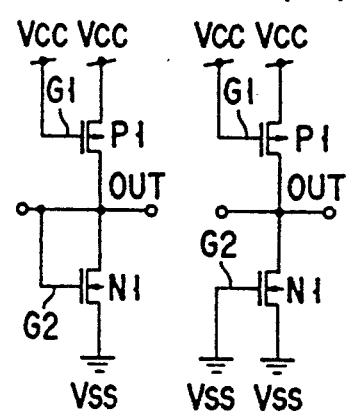
FIG. 2(D)
FIG. 2(E)
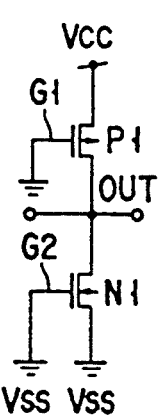
FIG. 2(F)

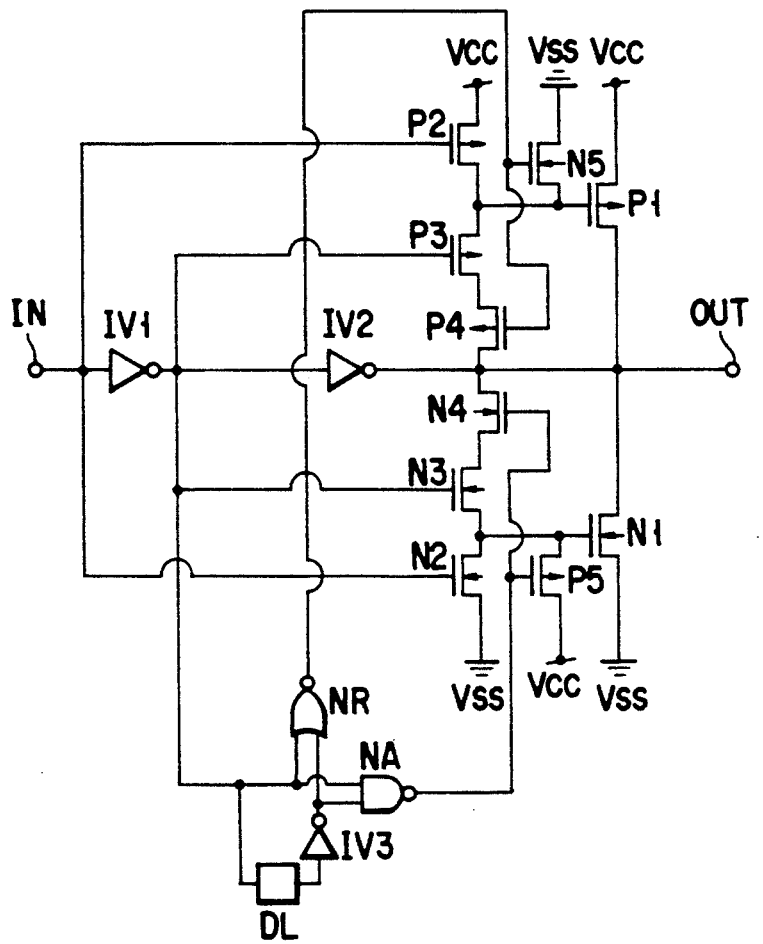
F I G. 10

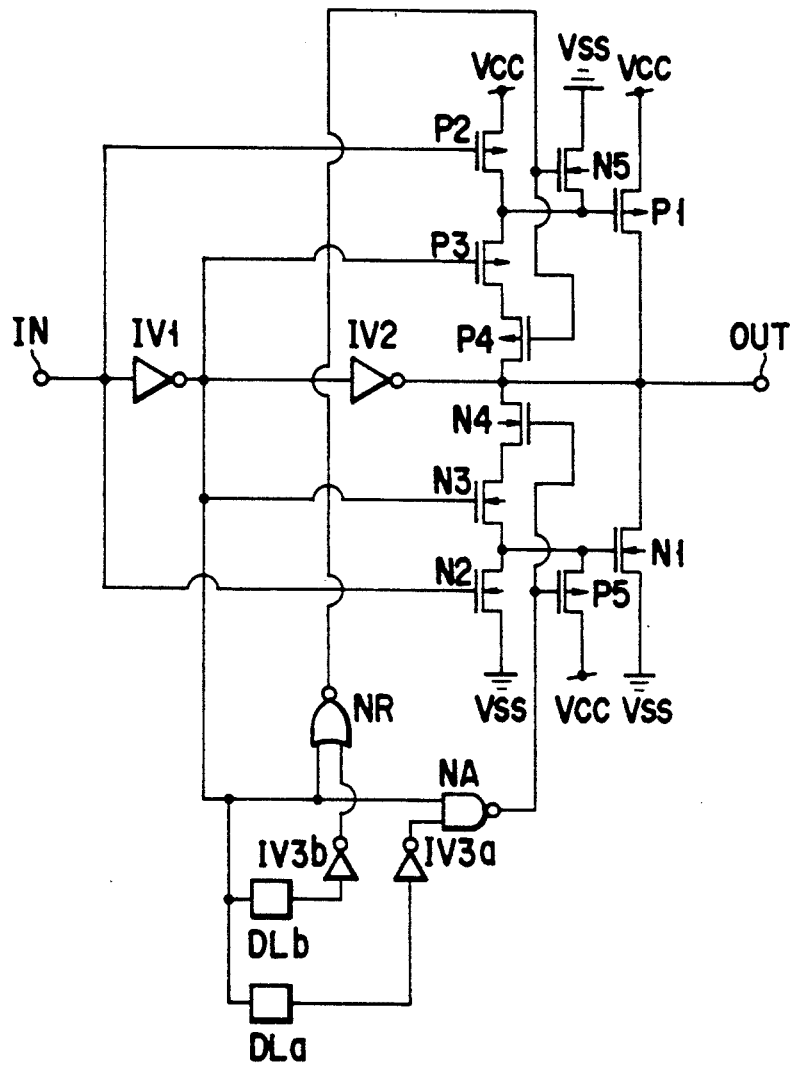
F I G. 12

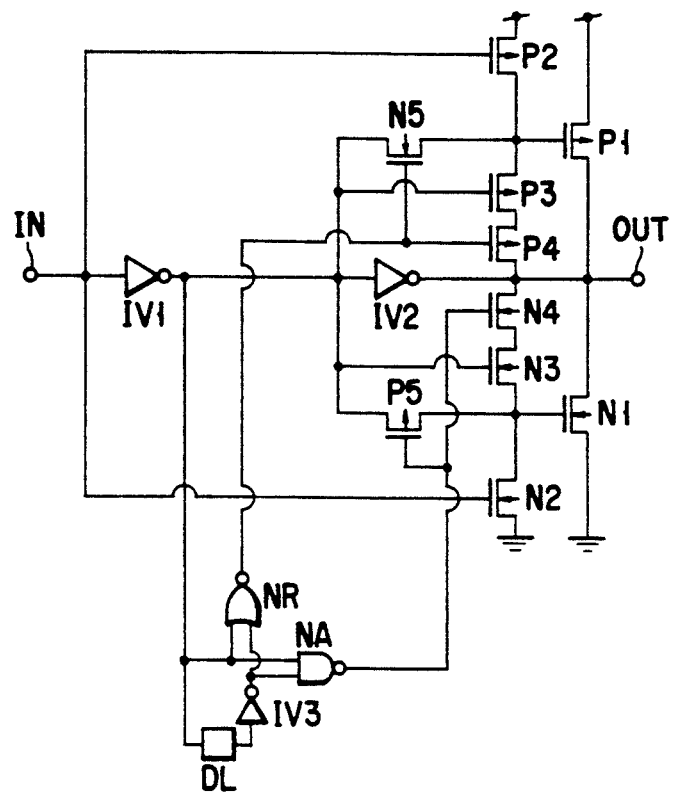
F I G. 15
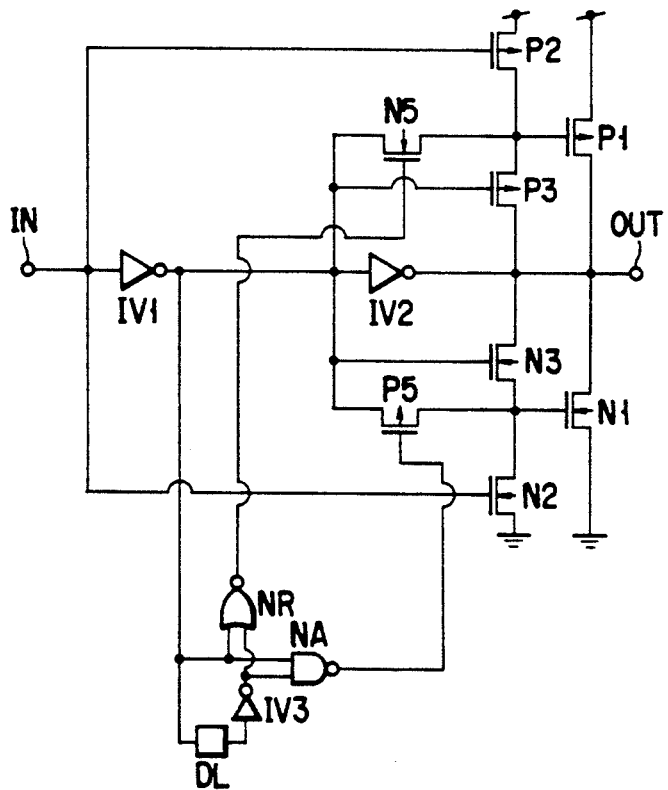
F I G. 16

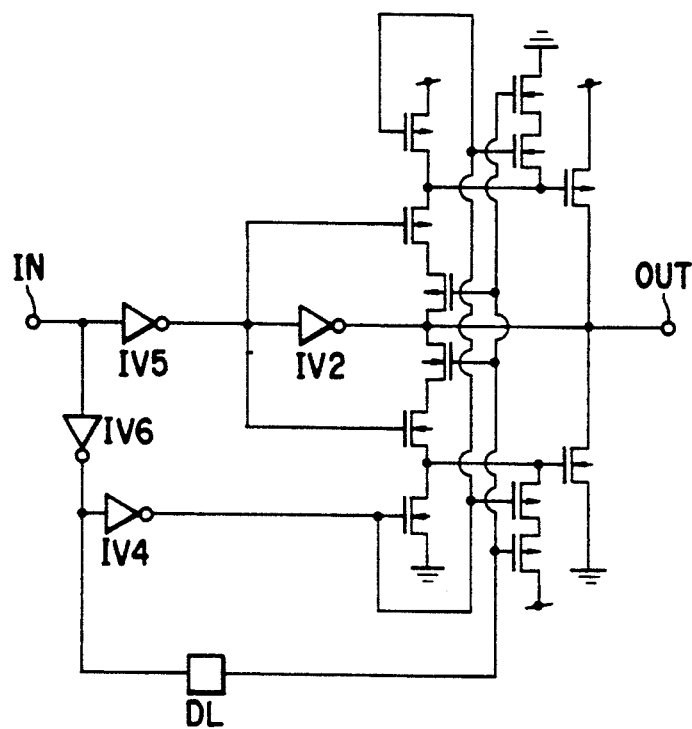
F I G. 19
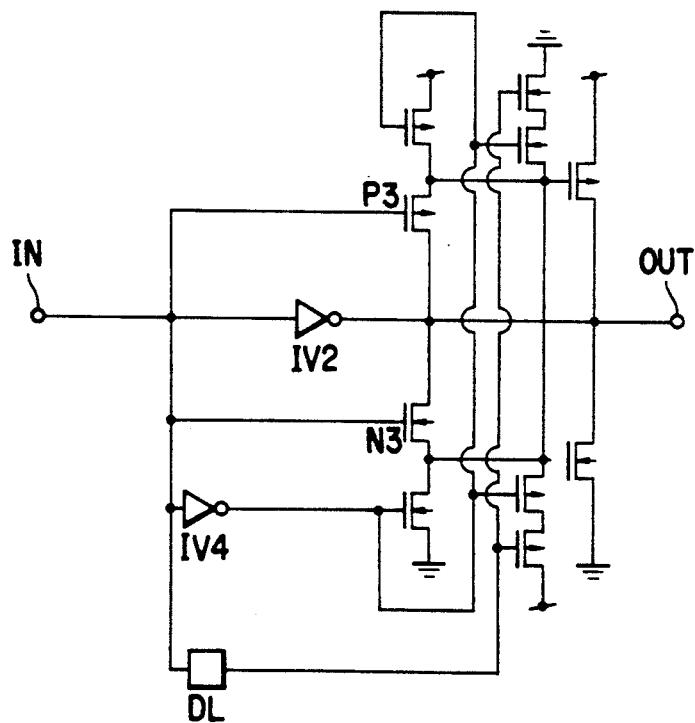
F I G. 20

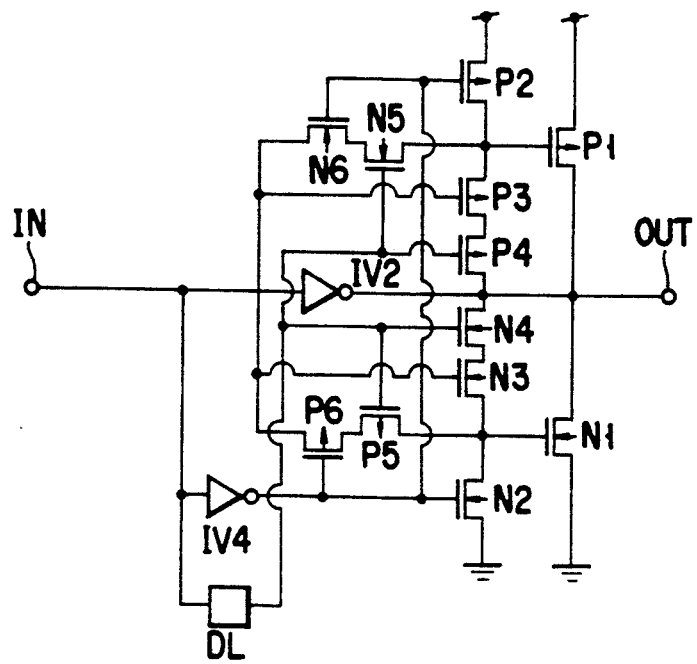
F I G. 21
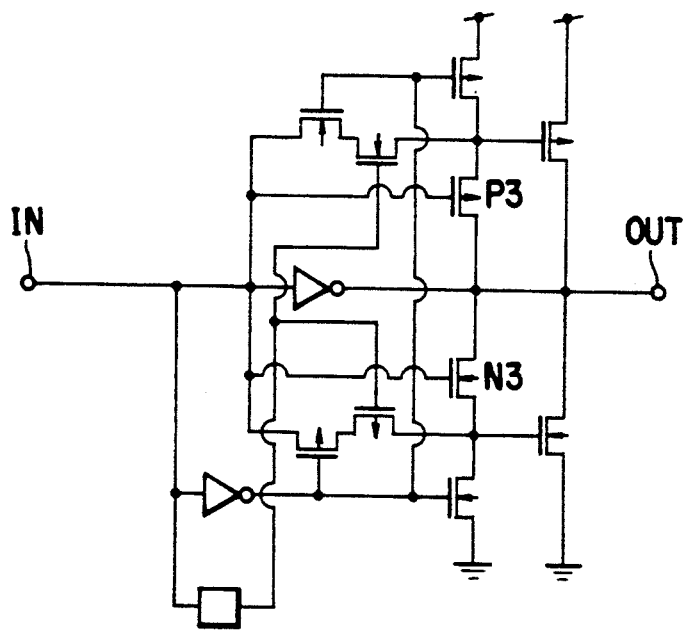
F I G. 22

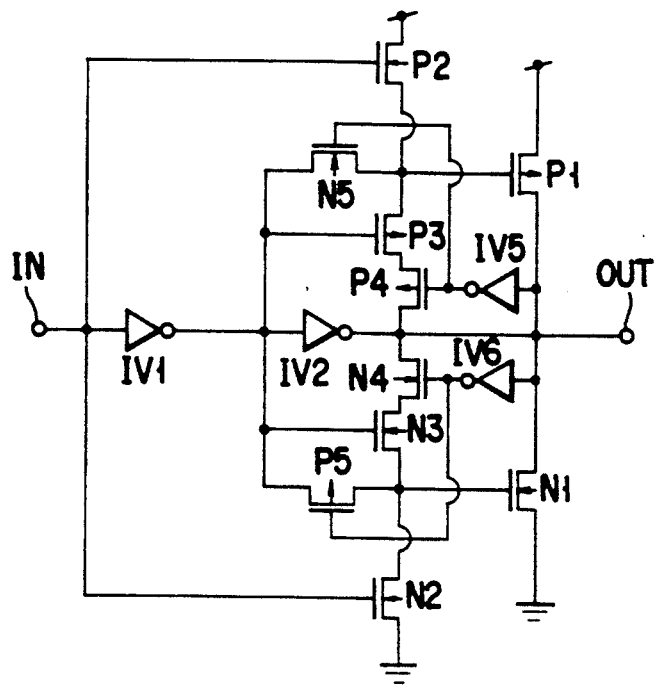
F I G. 23
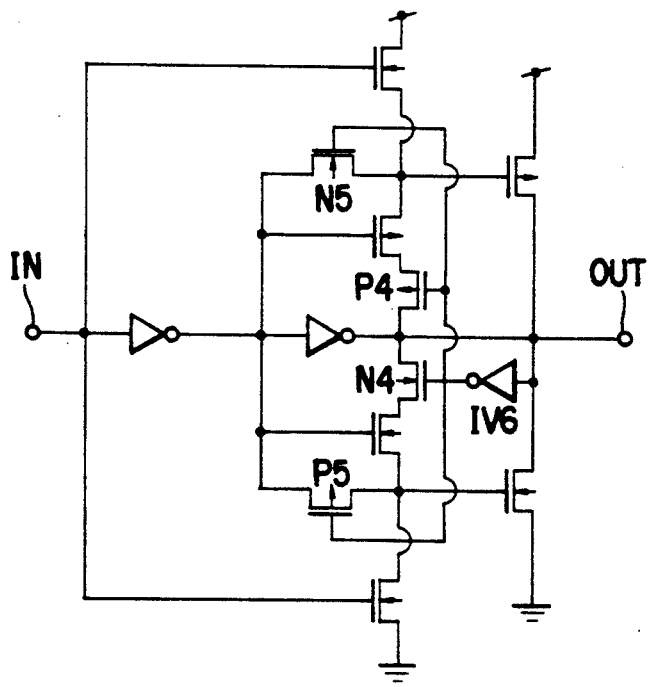
F I G. 24

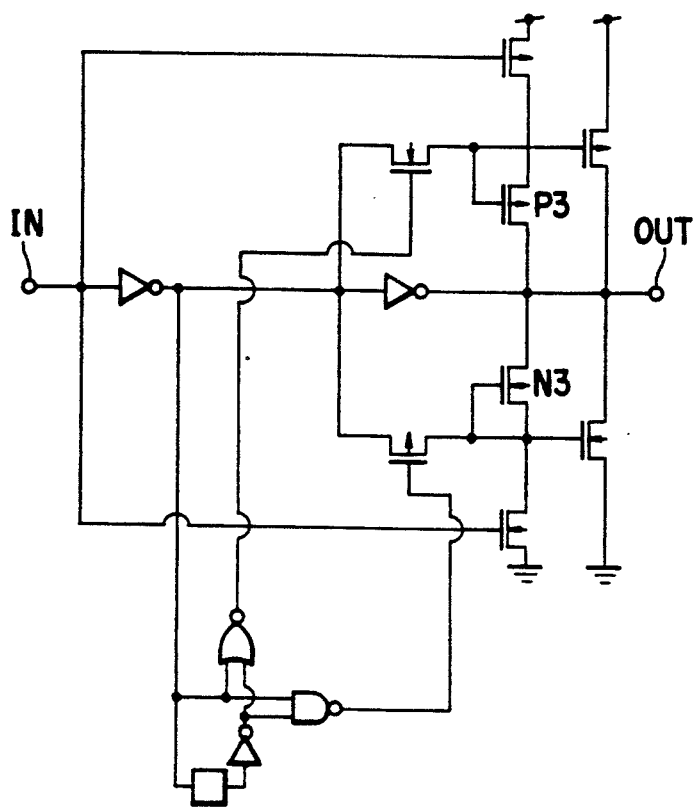
F I G. 31
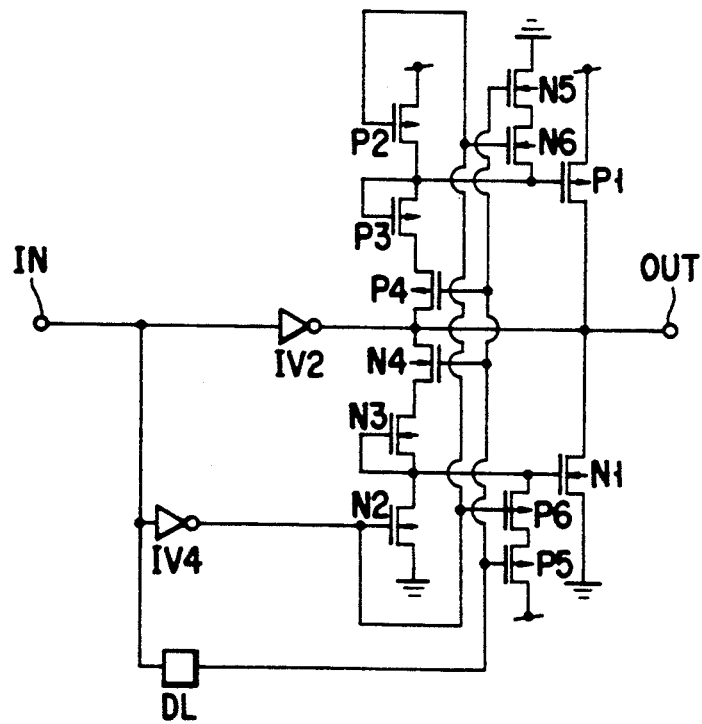
F I G. 32

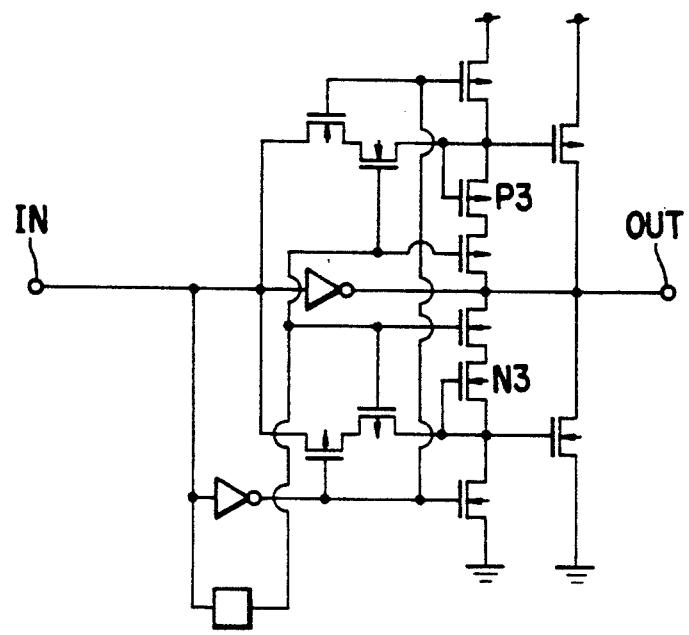
F I G. 35
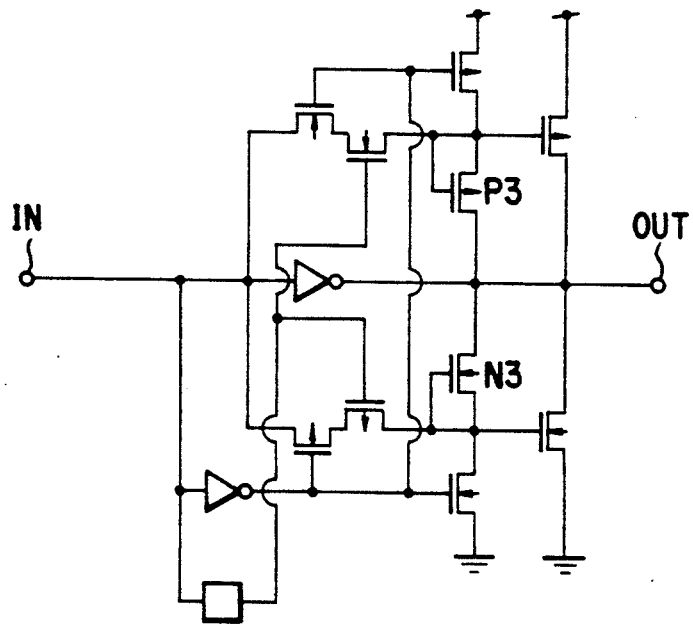
F I G. 36

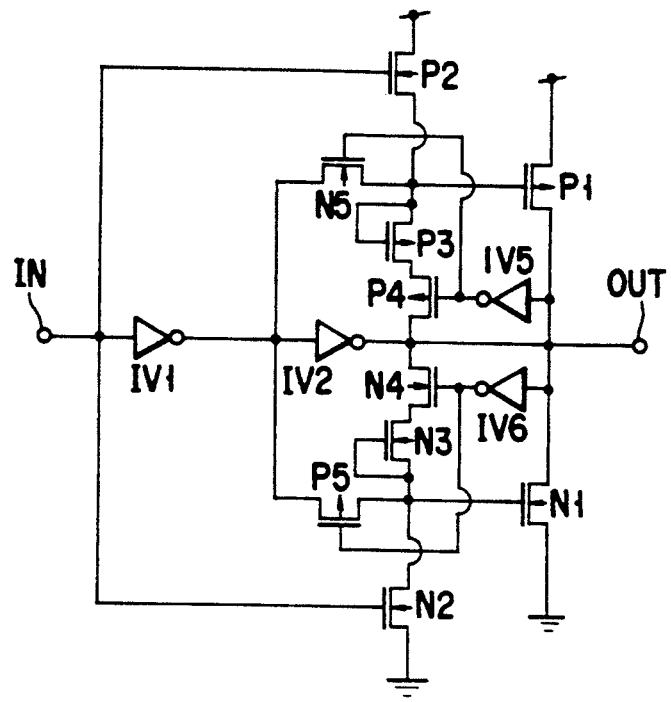
F I G. 37
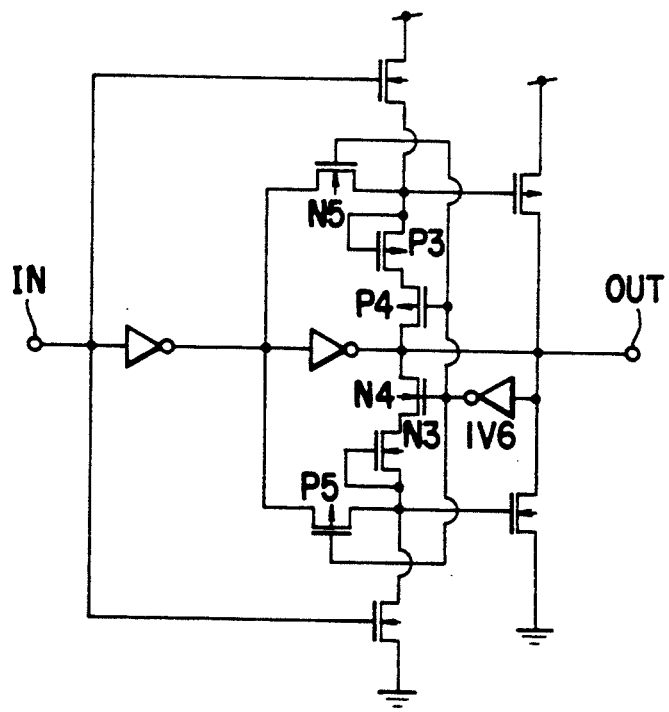
F I G. 38

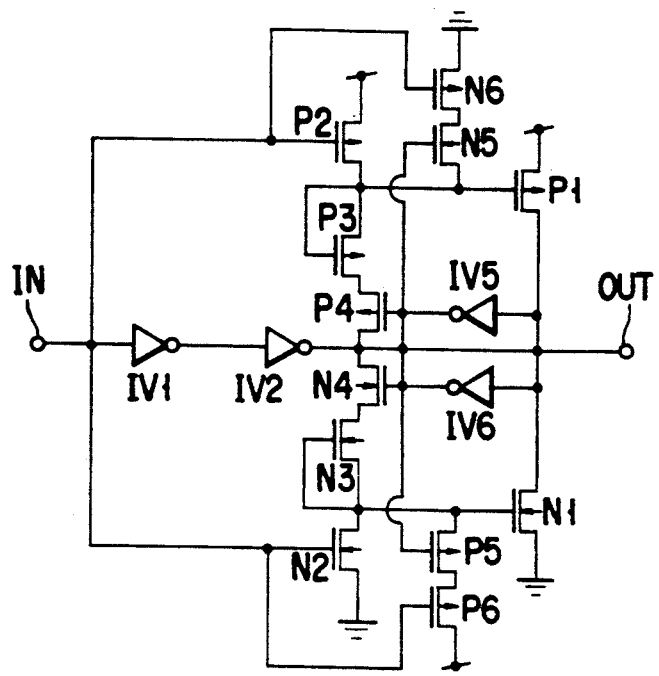
F I G. 39
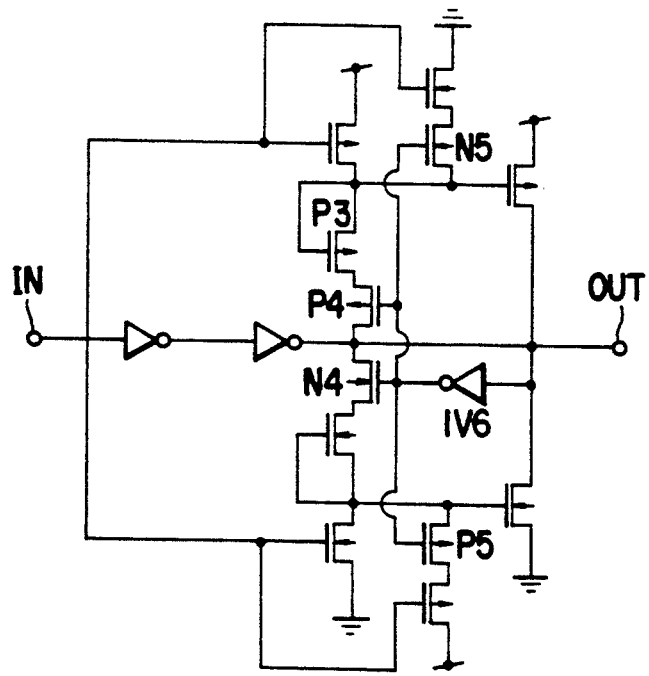
F I G. 40

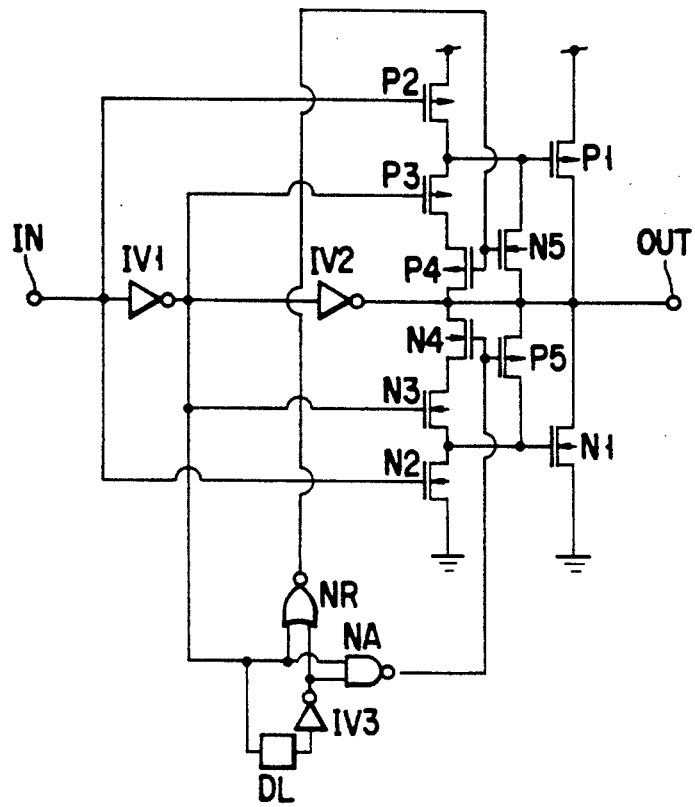
F I G. 41
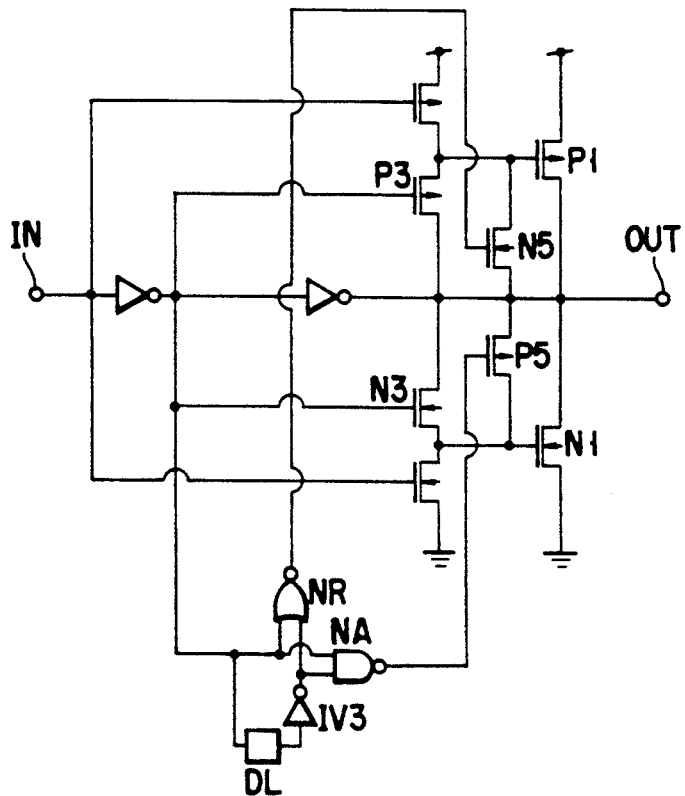
F I G. 42

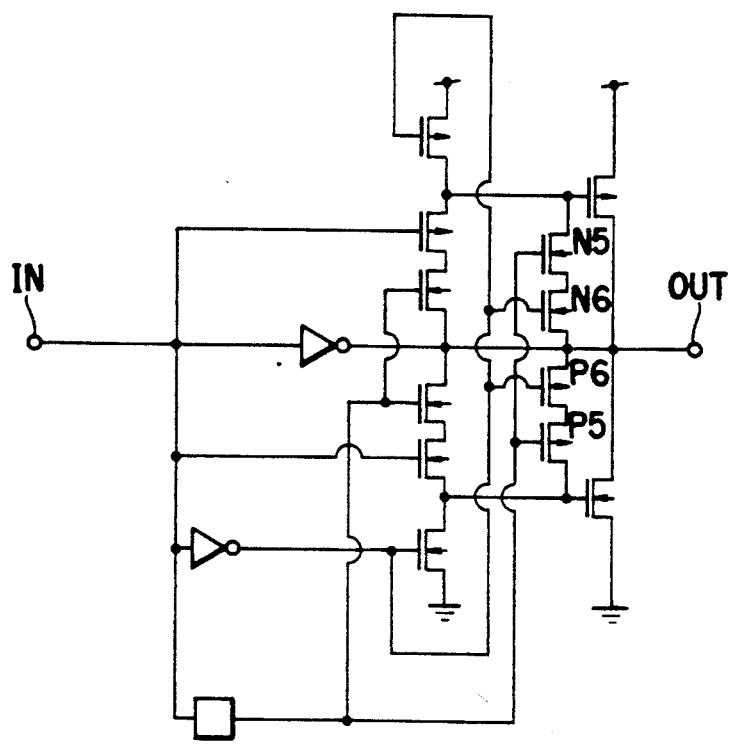
F I G. 43
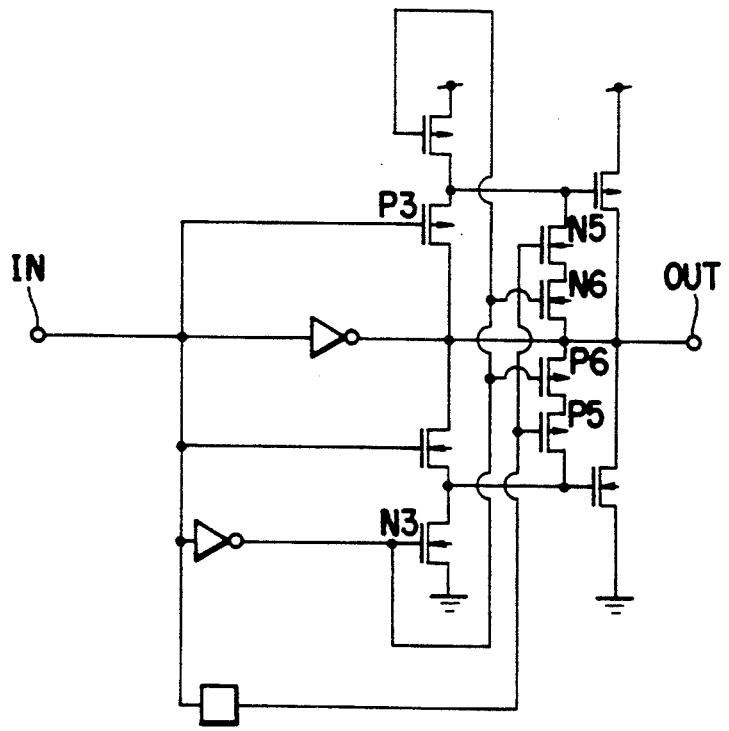
F I G. 44

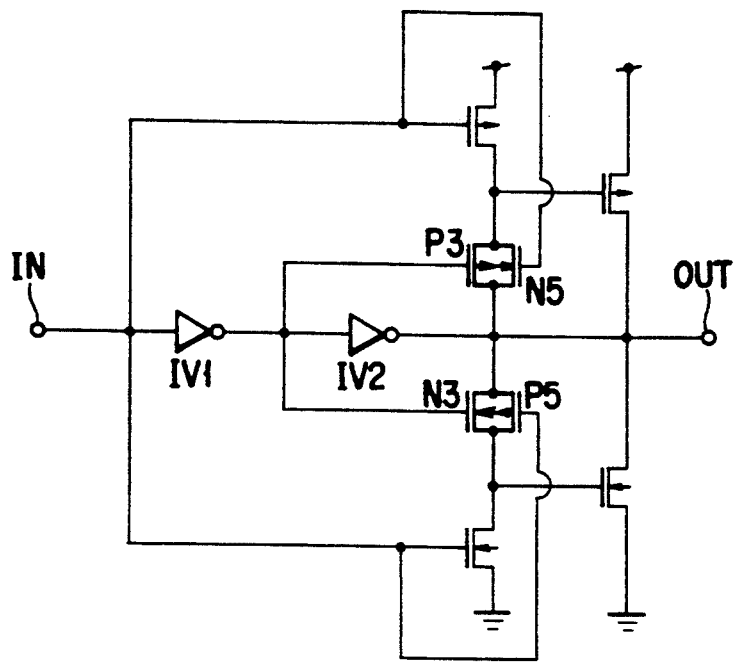
F I G. 45
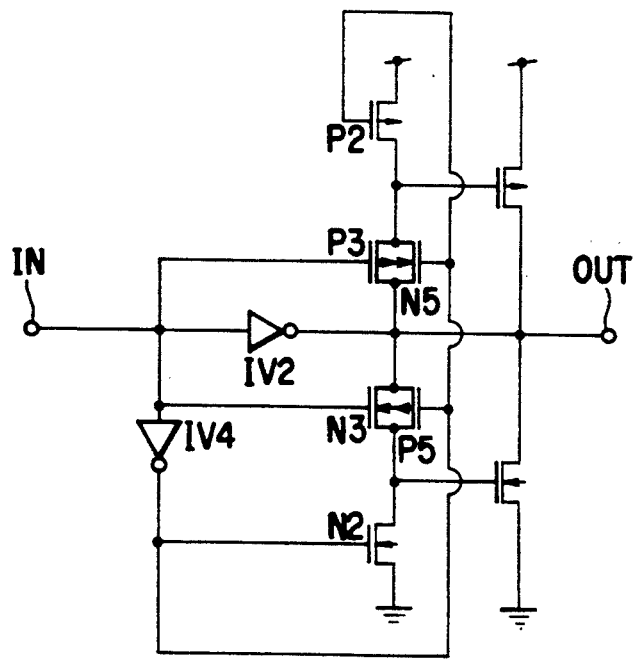
F I G. 46

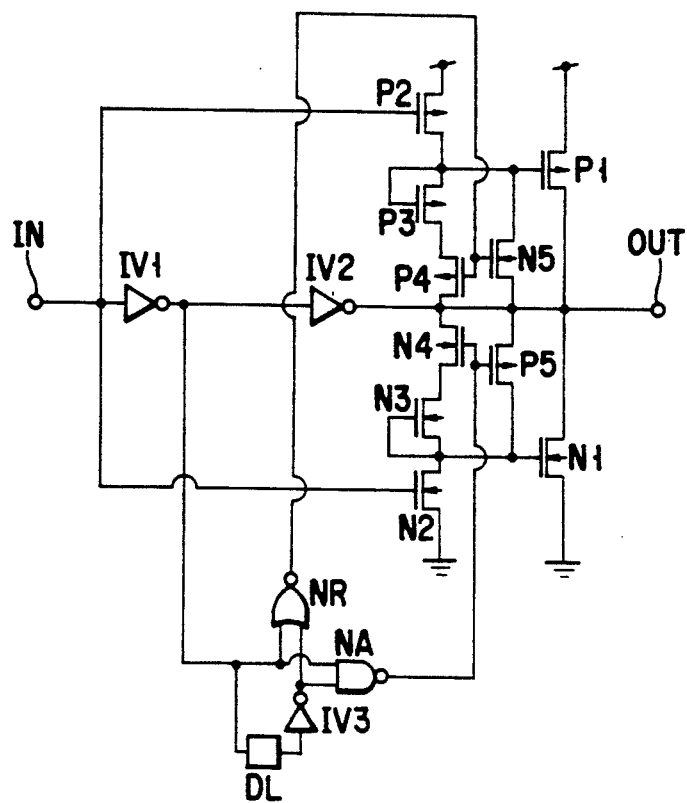
F I G. 47
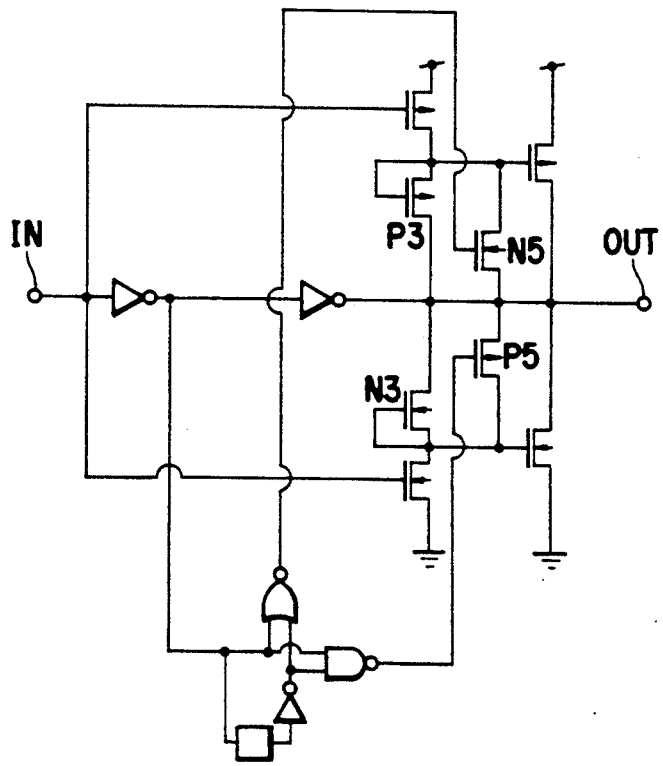
F I G. 48

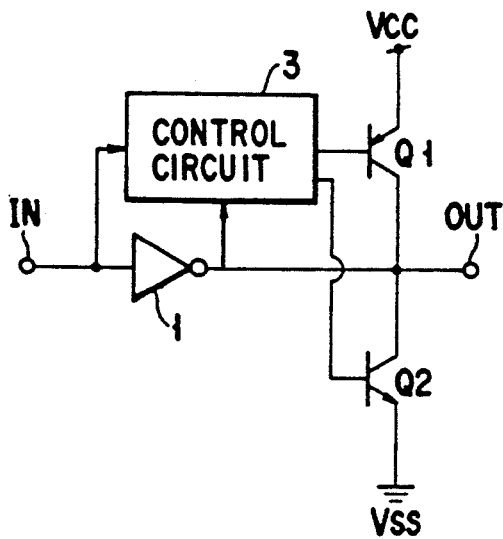
F I G. 53
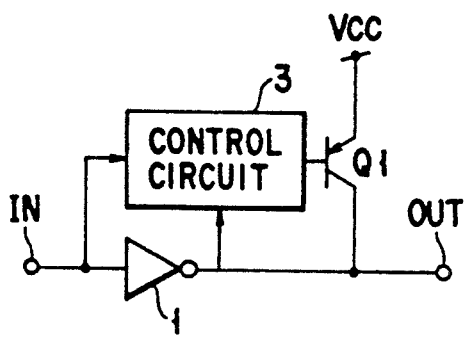
F I G. 54
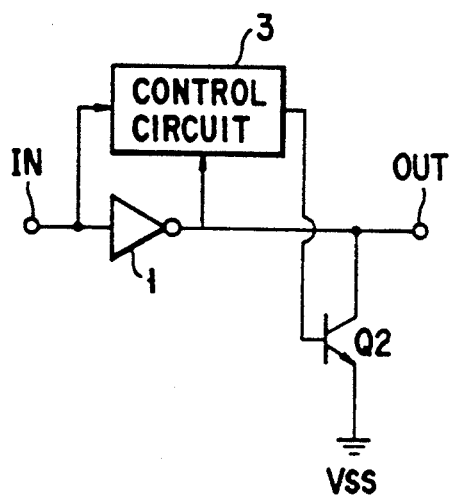
F I G. 55

OUTPUT BUFFER CIRCUIT

BACKGROUND OF THE INVENTION

1. Field of the Invention

The present invention relates to an output buffer circuit formed in a semiconductor integrated circuit device and, more particularly, to an output buffer circuit capable of suppressing power supply noise generated when an output is changed and suppressing leakage of the power supply noise to an output node.

2. Description of the Related Art

In a semiconductor integrated circuit device, when an output from an output buffer circuit is to be changed, an increase or decrease in power supply potential or ground potential is caused by an induced electromotive voltage determined by a product "L×di/dt" where L is an inductance of a power supply line or a ground line and di/dt is a rate of change in output current. These potential variations (power supply noise) are transmitted to an output node through a transistor constituting part of the output buffer circuit to cause output noise. Especially, when a plurality of output buffer circuits perform switching operations simultaneously, the output noise is increased to cause erroneous operations of other circuits in the semiconductor integrated circuit device or erroneous operations of input circuits of other semiconductor integrated circuits connected to the output node. Such noise is called simultaneous switching noise (SSN). The SSN tends to be increased as the micropatterning size of a semiconductor element is decreased and the operation speed is increased recently.

Conventionally, in order to minimize the potential variation in the power supply or the output as described above, efforts have been made to decrease the inductance L of the power supply line or the ground line or to decrease the rate of change di/dt in output current. The inductance L, however, is mainly determined by the length of the lead frame or the bonding wire, and it is not easy to shorten the lead frame or the bonding wire. Also, the speed of an output signal (a rise time tr or a fall time tf) and a propagation delay time tpd of a signal propagation line are normally defined as the design specifications. When di/dt is decreased, tr and tf, and thus tpd are increased, and the specified values cannot be satisfied. In other words, in order to increase the rate of change in output signal, the output current of the output buffer circuit must be increased. When the speed of the output signal is determined, the lower limit of the di/dt is determined. Hence, the di/dt cannot be simply decreased, and it is difficult to minimize the potential variation.

Generally, the specifications of the output current of an output buffer circuit include AC specifications (determined in accordance with the rate of change in output signal) and DC specifications (a source current $I_{OH}$ and a sink current $I_{OL}$ when the output is stationary). In an integrated circuit having high-speed specifications, when the output current is determined in accordance with the AC specifications, the DC specifications are often automatically satisfied. Since the out-put currents ($I_{OH}$, $I_{OL}$) of the DC specifications of the output buffer circuit are automatically determined from the AC specifications, the output resistance (an ON resistance $R_{ON}$) when the output is stationary is also automatically determined.

Assume that the output buffer circuit is a CMOS inverter comprising a p-channel MOS transistor and an n-channel MOS transistor. When the input signal is at Vcc level (potential of the high potential-side power supply), the p-channel MOS transistor is turned off, and the n-channel MOS transistor is turned on. The ON resistance $R_{ON}$ ($=V_{OL}/I_{OL}$) of the n-channel MOS transistor is determined by an output potential $V_{OL}$ at "L" level and the sink current $I_{OL}$ at this time. When the input signal is at Vss level (potential of the low potential-side power supply; ground potential), the n-channel MOS transistor is turned off, and the p-channel MOS transistor is turned on. The ON resistance $R_{ON}$ ($=\{Vcc-V_{OH}\}/I_{OH}$) of the p-channel MOS transistor is determined by an output potential $V_{OH}$ at "H" level and the source current $I_{OH}$ at this time.

When an output from the output buffer circuit is changed, the level of the output noise appears as a bounce quantity $\Delta E_B$ of the power supply potential or the ground potential divided by a rate of the ON resistance $R_{ON}$ of the output buffer circuit to a load impedance Z of the output node. When the load impedance Z is a capacitive load (i.e., a capacitance $C_L$), output noise $V_{OLP}$ when the output is at "L" level becomes substantially $\Delta E_B/(1+S.C_L.R_{ON})$, and the higher $R_{ON}$, the lower $V_{OLP}$. The fact that the ON resistance $R_{ON}$ is automatically determined by the AC specifications of the output buffer circuit means that when the speed of the output signal is determined, the lower limit of the output noise $V_{OLP}$ is determined. This applies to output noise $V_{OHV}$ when the output is at "H" level.

As described above, in the conventional output buffer circuit, since the ON resistance $R_{ON}$ which is automatically determined by the AC specifications of the output buffer circuit, is low when compared to that determined only from the DC specifications, a variation in the power supply potential or the ground potential when the output is changed can easily adversely affect the output node, and the output noise $V_{OLP}$ or $V_{OHV}$ tends to be unpreferably increased.

SUMMARY OF THE INVENTION

It is, therefore, an object of the present invention to provide an output buffer circuit capable of suppressing a variation in the output potential caused by power supply noise.

It is another object of the present invention to provide an output buffer circuit which has an output resistance automatically determined from AC specifications when an output is changed and a large output resistance determined only from DC specifications when the output is stationary, in which a variation in a power supply potential or a ground potential when the output is changed does not easily adversely affect an output node, and which can suppress output noise.

The objects of the present invention described above are achieved by an output buffer circuit comprising a first output buffer having an input node to which an input signal is supplied and an output resistance determined from DC specifications, a second output buffer having an output node connected to an output node of the first output buffer and an output resistance which satisfies AC specifications when the second output buffer is driven simultaneously with the first output buffer, and a control circuit for driving the second output buffer when an output from the first output buffer is changed and setting the output node of the second output buffer in the high-impedance state when the output from the first output buffer is stationary.

According to this arrangement, when the output is changed, the first and second output buffers are simultaneously driven, and thus the AC specifications can be satisfied, and when the output from the first output buffer circuit is stationary, only the first output buffer is driven to satisfy the DC specifications. As a result, although the variation in the power supply potential or the ground potential upon a change in output level is the same level as in the conventional output buffer circuit, since the output resistance obtained when the output is stationary can be higher than that in the conventional output buffer circuit, the variation in the power supply potential or the ground potential will not easily affect the output node, and the output noise is suppressed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram of an output buffer circuit according to the first embodiment of the present invention;

FIGS. 2A to 2F are circuit diagrams showing a control sequence for a second output buffer by a control circuit shown in FIG. 1;

FIG. 10 is a circuit diagram showing an arrangement of an output buffer circuit having a control circuit which performs control in accordance with the sequence of FIGS. 2A to 2F on the basis of a change in input signal;

FIGS. 12 to 17 are circuit diagrams respectively showing modifications of the circuit shown in FIG. 10;

FIGS. 18 to 22 are circuit diagrams respectively showing modifications of the circuit shown in FIG. 17;

FIG. 23 is a circuit diagram of an arrangement of an output buffer circuit having a control circuit which discriminates the level of an output node and performs control in accordance with the sequence shown in FIGS. 2A to 2F;

FIGS. 24 to 26 are circuit diagrams respectively showing modifications of the circuit shown in FIG. 23;

FIGS. 28 to 32 are circuit diagrams respectively showing modifications of the circuit shown in FIG. 27;

FIGS. 34 to 36 are circuit diagrams respectively showing modifications of the circuit shown in FIG. 32;

FIG. 37 is a circuit diagram showing another arrangement of an output buffer circuit having a control circuit which discriminates the level of the output node and performs control in accordance with the sequence shown in FIGS. 3A to 3L;

FIGS. 38 to 40 are circuit diagrams respectively showing modifications of the circuit shown in FIG. 37;

FIG. 41 is a circuit diagram showing still another arrangement of an output buffer circuit having a control circuit which performs control in accordance with the sequence shown in FIGS. 4A to 4L on the basis of a change in input signal;

FIGS. 42 to 46 are circuit diagrams respectively showing modifications of the circuit shown in FIG. 41;

FIG. 47 is a circuit diagram showing still another arrangement of an output buffer circuit having a control circuit which performs control in accordance with the sequence shown in FIGS. 5A to 5C on the basis of a change in input signal;

FIGS. 48 to 52 are circuit diagrams respectively showing modifications of the circuit shown in FIG. 47;

FIG. 53 is a circuit diagram of a second output buffer in an output buffer circuit according to the sixth embodiment of the present invention;

FIG. 54 is a circuit diagram of a second output buffer in an output buffer circuit according to the seventh embodiment of the present invention; and FIG. 55 is a circuit diagram of a second output buffer in an output buffer circuit according to the eighth embodiment of the present invention.

DETAILED DESCRIPTION OF THE PREFERRED EMBODIMENTS

Figures 3A, 3B, 3C, 3D, 3E:
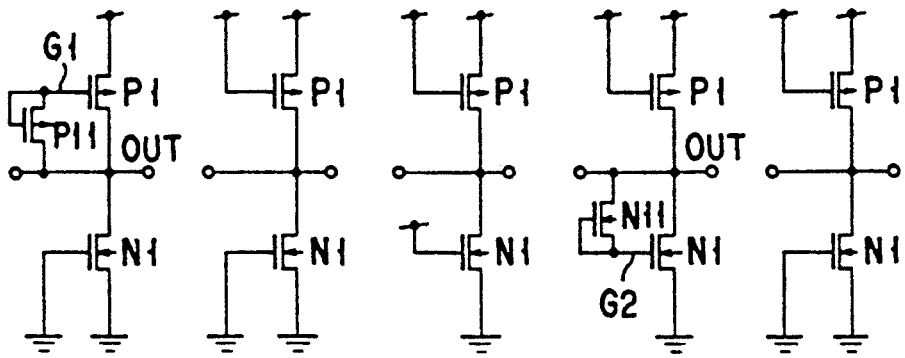
FIGS. 3A to 3L are circuit diagrams showing another control sequence for the second output buffer by the control circuit shown in FIG. 1.

FIG. 1 shows an output buffer circuit according to the first embodiment of the present invention. This output buffer circuit has first and second output buffers 1 and 2 and a control circuit 3. The first output buffer 1 comprises, e.g., a CMOS inverter. The input node of the output buffer 1 is connected to an input terminal IN and its output node is connected to an output terminal OUT. The characteristic (the sizes of the respective MOS transistors: a ratio W/L of a channel width to a channel length) of the output buffer 1 is set such that the output buffer 1 has an output resistance $R_{ON}$ determined only by DC specifications. The second output buffer 2 comprises a p-channel MOS transistor P1 and an n-channel MOS transistor N1 whose current paths are connected in series between a power supply Vcc and a ground terminal Vss. The gates of the MOS transistors P1 and N1 are connected to the output terminal of the control circuit 3, and the connecting point of the current paths is connected to the output terminal OUT. The characteristic (the sizes of the MOS transistors P1 and N1: the ratio W/L of a channel width to a channel length) of the output buffer 2 is set such that AC specifications are satisfied when it is driven simultaneously with the output buffer 1. The control circuit 3 comprises, e.g., a plurality of MOS transistors and is responsive to the level of a signal (an output signal from a semiconductor integrated circuit device (not shown) connected to its input stage) supplied from the input terminal IN or the level of the output terminal OUT to control the gate potentials of the MOS transistors P1 and N1 of the output buffer 2. In this control, the control circuit 3 drives the output buffer 2 when an output from the output buffer 1 is changed, and sets an output from the output buffer 2 at the high-impedance state when the output from the output buffer 1 is stationary.

The operation of the output buffer circuit shown in FIG. 1 will be briefly described. When an input signal is changed, an output signal from the output buffer 1 is changed, and the MOS transistor P1 or N1 in the output buffer 2 is driven by the control circuit 3 simultaneously or almost simultaneously, thus satisfying the AC specifications. When the input signal to the output buffer 1 is stationary, the output signal from the output buffer 1 is stationary, the MOS transistors P1 and N1 in the output buffer 2 are controlled to be in the high-resistance or OFF state by the control circuit 3, and the output from the output buffer 2 is set in the high-impedance state. When the output from the output buffer 2 is stationary, only the output buffer 1 is driven to satisfy the DC specifications. As a result, even if the variation in the power supply potential Vcc or ground potential Vss upon a change in output stays at the same level as in the conventional case, since the output resistance $R_{ON}$ obtained when the output is stationary is higher than in the conventional case, the variation in the power supply potential Vcc or ground potential Vss will not easily adversely affect the output terminal OUT, thereby suppressing the output noise.

Various sequences of controlling the output buffer 2 by the control circuit 3 will be described in detail.

FIGS. 2A to 2F show a control sequence of the changes in connection (control of the potential to be applied) of gates G1 and G2 of the MOS transistors P1 and N1, respectively, when an output from the output buffer 2 is changed from "H" (Vcc) to "L" level (Vss) and then to "H" level again. Note that an output from the output buffer 1 is also changed from "H" to "L" level and then to "H" level again.

More specifically, when the output terminal OUT is stationary at "H" level, the gate G1 of the MOS transistor P1 is connected to the output terminal OUT to set the MOS transistor P1 in the OFF state and the gate G2 of the MOS transistor N1 is connected to the ground terminal Vss to set the MOS transistor N1 in the OFF state, as shown in FIG. 2A, so that the output from the output buffer 2 is set in the high-impedance state. When the output terminal OUT is to be changed from "H" to "L" level, the input signal is changed from "L" to "H" level. Simultaneously, the gate G1 is connected to the power supply Vcc to set the MOS transistor P1 in the OFF state, as shown in FIG. 2B, and the gate G2 is connected to the power supply Vcc to set the MOS transistor N1 in the ON state, as shown in FIG. 2C, so that the current intake capability of the output terminal OUT is increased. In this case, if generation of the through current between the power supply Vcc and the ground terminal Vss and a decrease in operation speed result, the gate G1 may be kept in the state of FIG. 2A until an intermediate point while the output terminal OUT is changed to "L" level by the output from the output buffer 1 or until an intermediate point while the output terminal OUT is changed to "L" level by the MOS transistor N1. This is accomplished by temporarily setting the MOS transistor P1 in an ON state, and then connecting the gate node G1 to the power supply $V_{cc}$ to set the MOS MOS transistor P1. This is accomplished by temporarily setting the MOS transistor N1 in an ON state, and then connecting the gate node G2 to the ground terminal $V_{SS}$ to set the transistor P1 in the OFF state. During or after this change of the output terminal OUT from "H" to "L" level, the gate G2 is connected to the output terminal OUT to set the MOS transistor N1 in the OFF state, as shown in FIG. 2D. Therefore, when the output terminal OUT is stationary at "L" level, the gate G1 is connected the power supply Vcc to set the MOS transistor P1 in the OFF state and the gate G2 is connected to the output terminal OUT to set the MOS transistor N1 in the OFF state, as shown in FIG. 2D, so that the output node of the output buffer 2 is set in the high-impedance state.

When the output terminal OUT is to be changed from "L" to "H" level, the input signal is changed from "H" to "L" level, and simultaneously the gate 2 is connected to the ground terminal Vss to set the MOS transistor N1 in the OFF state, as shown in FIG. 2E. Furthermore, the gate G1 is connected to the ground terminal Vs to set the MOS transistor P1 in the ON state, as shown in FIG. 2F, so that the current discharge capability is increased. In this case, if generation of the through current between the power supply Vcc and the ground terminal Vss and a decrease in operation speed result, the gate G2 may be kept in the state of FIG. 2D until an intermediate point while the output terminal OUT is changed to "H" level by the output from the output buffer 1 or until an intermediate point while the output terminal OUT is changed to "H" level by the MOS transistor N1 in the OFF state. During or after this change of the output terminal OUT from "L" to "H" level, the gate G1 is connected to the output terminal OUT to set the MOS transistor P1 in the OFF state, as shown in FIG. 2A. Therefore, when the output terminal OUT is stationary at "H" level, the gate G1 is connected the output terminal OUT to set the MOS transistor P1 in the OFF state and the gate G2 is connected to the ground terminal Vss to set the MOS transistor N1 in the OFF state, as shown in FIG. 2A, so that the output node of the output buffer 2 is set in the high-impedance state.

When the output terminal OUT is stationary at "L" or "H" level (the output from the output buffer 2 is in the high-impedance state) even if the potential of the output terminal OUT temporarily fluctuates to the potential of the power supply Vcc or that of the ground terminal Vss, since the MOS transistors P1 and N1 of the output buffer 2 are diode-connected to be reverse-biased, the potential of the output terminal OUT will not be adversely affected. Also, the variation in the potential of the power supply Vcc or of the ground terminal Vss can hardly be unpreferably transmitted to the output terminal OUT through a junction diode formed by a semiconductor body (n type) and a p-type impurity region (source region) in which the MOS transistor P1 is formed or a junction diode formed by a semiconductor body (p type) and an n-type impurity region (drain region) in which the MOS transistor N1 is formed. This is because the potential variation is transmitted to the output terminal OUT through the output buffer 1 to slightly change the level of the output terminal OUT, and thus the junction diodes will not be forward-biased.

Overshooting of the potential of the power supply Vcc or undershooting of the potential of the ground terminal Vss will not be unpreferably transmitted to the output terminal OUT unless its amplitude exceeds the absolute value of the threshold voltage of the MOS transistor P1 or N1 of the output buffer 2.

If a difference ($V_{OL}$) between the "L"-level potential of the output terminal OUT and the potential of the ground terminal Vss is equal to or less than the threshold voltage of the MOS transistor N1 of the output buffer 2 and if a difference (Vcc-$V_{OH}$) between the potential of the power supply Vcc and the "H"-level potential of the output terminal OUT is equal to or less than the absolute value of the threshold voltage of the MOS transistor P1, the output current is determined by only the output buffer 1. If the difference ($V_{OL}$) between the "L"-level potential of the output terminal OUT and the potential of the ground terminal Vss exceeds the threshold voltage of the MOS transistor N1 of the output buffer 2 and if the difference (Vcc-$V_{OH}$) between the potential of the power supply Vcc and the "H"-level potential of the output terminal OUT exceeds the absolute value of the threshold voltage of the MO transistor P1, the output buffer 2 is also operated, and thus the resistance to noise input to the output terminal OUT becomes high.

FIGS. 3A to 3F show another control sequence of the changes in connection (control of the potential to be applied) of the gates G1 and G2 of the MOS transistors P1 and N1, respectively, when an output from the output buffer 2 is changed from "H" to "L" level and then to "H" level again. Note that an output from the output buffer 1 is also changed from "H" to "L" level and then to "H" level again.

FIGS. 3A to 3F are different from FIGS. 2A to 2F in the following points. That is, a p-channel MOS transistor P11 having a source and a gate connected to each other is inserted between the gate G1 and the output terminal OUT when the output buffer 2 is in the state shown in FIG. 3A, and an n-channel MOS transistor N11 having a gate and a source connected to each other is inserted between the output terminal OUT and the gate G2 when the output buffer 2 is in the state shown in FIG. 3D.

When the output buffer 2 is controlled as shown in FIGS. 3A to 3F, it is effective for use at a low power supply voltage. The reason for this will be described below. That is, when the output buffer 2 is set in the state shown in FIG. 2D, as the potential of the output terminal OUT is decreased to "L" level, the drive power of the MOS transistor N1 is also decreased. In contrast to this, when the output buffer 2 is set in the state shown in FIG. 3D, as the potential of the output terminal OUT is decreased to "L" level, the potential of the gate G2 is increased at least by the threshold voltage of the MOS transistor N11, and the drive power of the MOS transistor N1 is maintained. When the output buffer 2 is set in the state shown in FIG. 2A, as the potential of the output terminal OUT is increased to "H" level, the drive power of the MOS transistor P1 is decreased. However, when the output buffer 2 is set in the state shown in FIG. 3A, as the potential of the output terminal OUT is increased to "H" level, the potential of the gate G2 is decreased at least by the absolute value of the threshold voltage of the MOS transistor P11, and the drive power of the MOS transistor P1 is maintained. As a result, even if the power supply voltage is low, a reliable operation can be performed.

As still another control sequence, of FIGS. 2A to 2F, only FIG. 2A may be changed as shown in FIG. 3A, or only FIG. 2D may be changed as shown in FIG. 3D.

In the control sequence shown in FIGS. 2A to 2F, the gate G2 is connected to the power supply Vcc when the output buffer 2 is in the state shown in FIG. 2C. However, at this time, the gate G2 may be connected to another potential in place of the potential of the power supply Vcc to set the MOS transistor N1 in the ON state. Also, the gate G1 is connected to the ground terminal Vss when the output buffer 2 is in the state shown in FIG. 2F. However, at this time, the gate G1 may be connected to another potential in place of the potential of the ground terminal Vss to set the MOS transistor P1 in the ON state. When the potential of the output terminal OUT is used as this another potential, the output buffer is shifted from the state shown in FIG. 2B to the state shown in FIG. 2D, and then from the state shown in FIG. 2E to the state shown in FIG. 2A. The changes in circuit state of this case are shown in FIGS. 4A to 4D.

Similarly, in the control sequence shown in FIGS. 3A to 3F, the gate G2 is connected to the power supply Vcc when the output buffer 2 is in the state shown in FIG. 3C. However, at this time, the gate G2 may be connected to another potential in place of the potential of the power supply Vcc to set the MOS transistor N1 in the ON state. Also, the gate G1 is connected to the ground terminal Vss when the output buffer is in the state shown in FIG. 3F. However, at this time, the gate G1 may be connected to another potential in place of the potential of the ground terminal Vss to set the MOS transistor P1 in the ON state. When the potential of the output terminal OUT is used as this another potential, the output buffer 2 is shifted from the state shown in FIG. 3B to the state shown in FIG. 3D, and then from the state shown in FIG. 3E to the state shown in FIG. 3A. The change in circuit state of this case is shown in FIGS. 5A to 5D.

In the control sequences described above, when the output is changed from "H" to "L" level or vice versa, the output resistance is decreased. However, if the output resistance need be decreased only when the output is changed from "H" to "L" level, the second output buffer 2 comprising the n-channel MOS transistor N1 connected between the output terminal OUT and the ground terminal Vss may be used, and the control circuit 3 may be formed to control only the MOS transistor N1. Also, if the output resistance need be decreased only when the output is changed from "L" to "H" level, the second output buffer 2 comprising the p-channel MOS transistor P1 connected between the power supply Vcc and the output terminal OUT may be used, and the control circuit 3 may be formed to control only the MOS transistor P1.

Figures 3F, 3G, 3H, 3I:
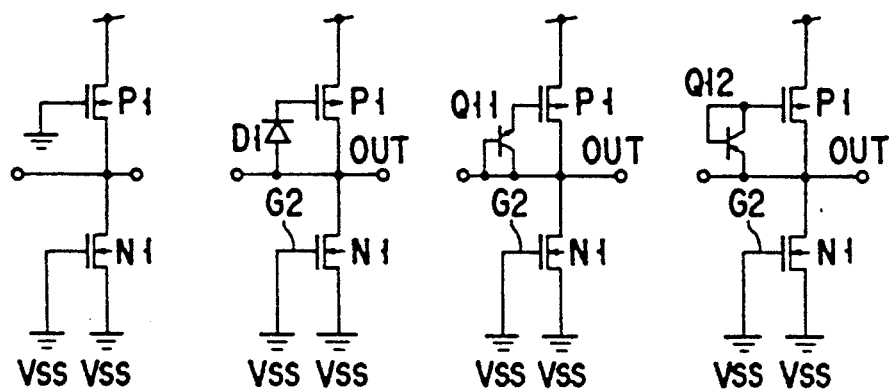

Referring to FIG. 3A, since the p-channel MOS transistor P11 has the source and gate connected to each other serves as a diode element, it can be replaced by other arrangements as follows. In FIG. 3G, a p-n junction diode D1 is provided. In FIG. 3H, an npn transistor Q11 having a base and a collector connected to each other is provided. In FIG. 3I, a pnp transistor Q12 having a base and a collector connected to each other is provided.

Figures 3J, 3K, 3L:
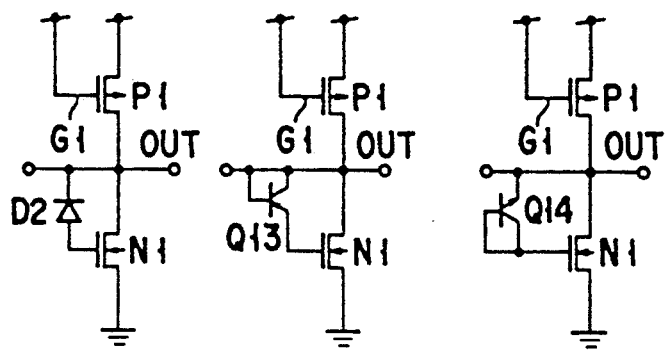
Figures 4A, 4B, 4C, 4D:
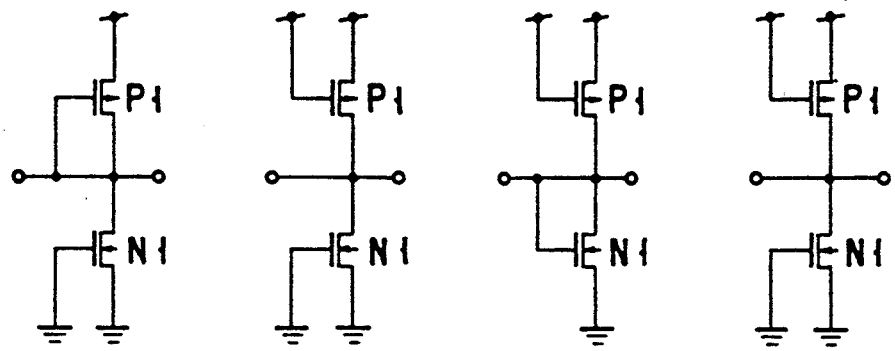
FIGS. 4A to 4D are circuit diagrams showing a control sequence for the second output buffer by a modification of the control circuit shown in FIG. 1.
Figures 5A, 5B, 5C:
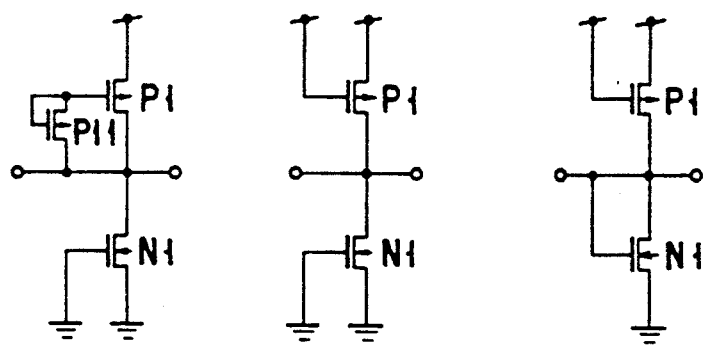
FIGS. 5A to 5F are circuit diagrams showing another control sequence for the second output buffer by the modification of the control circuit shown in FIG. 1.
Figures 5D, 5E, 5F:
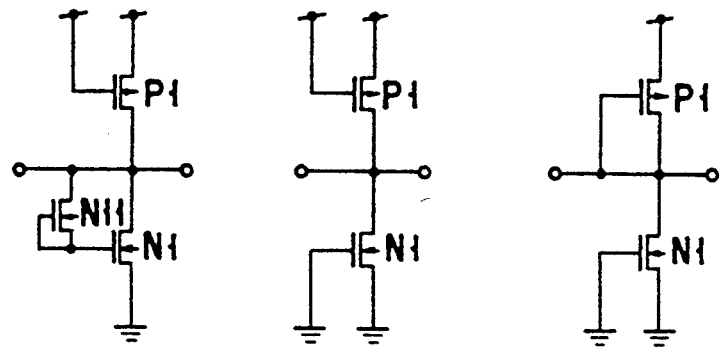

Furthermore, referring to FIG. 3D, since the n-channel MOS transistor N11 has the gate and source connected to each other also serves as a diode element, it can be replaced by other arrangements as follows. In FIG. 3J, a p n junction diode D2 is provided. In FIG. 3K, a pnp transistor Q13 having a base and a collector connected to each other is provided. In FIG. 3L, an npn transistor Q14 having a base and a collector connected to each other is provided.

Figure 6A:
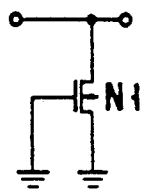
FIGS. 6A to 6C are circuit diagrams showing a control sequence for a second output buffer by a control circuit in an output buffer circuit according to the second embodiment of the present invention.
Figure 6B:
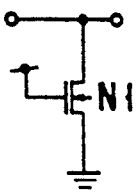
Figure 6C:
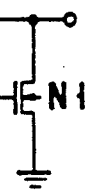
Figure 7A:
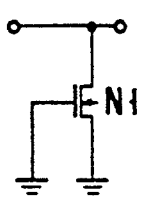
FIGS. 7A to 7C are circuit diagrams showing a control sequence for a second output buffer by a control circuit in an output buffer circuit according to the third embodiment of the present invention.
Figure 7B:
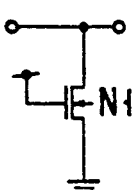
Figure 7C:
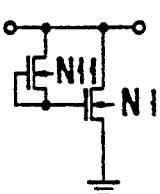

FIGS. 6A, 6B, and 6C, and FIGS. 7A, 7B, and 7C show control sequences to control the gate G2 of the MOS transistor N1 when the n-channel MOS transistor N1 has a current path connected between the output terminal OUT and the ground terminal Vss. FIGS. 6A, 6B, and 6C correspond to FIGS. 2A, 2C, and 2D, and FIGS. 7A, 7B, and 7C correspond to FIGS. 3A, 3C, and 3D.

Figure 8A:
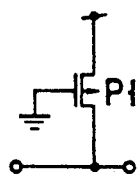
FIGS. 8A to 8C are circuit diagrams showing a control sequence for a second output buffer by a control circuit in an output buffer circuit according to the fourth embodiment of the present invention.
Figure 8B:
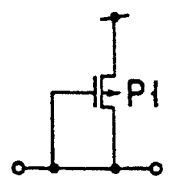
Figure 8C:
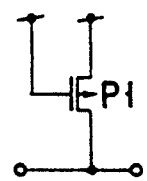
Figure 9A:
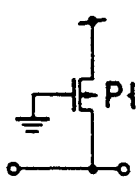
FIGS. 9A to 9C are circuit diagrams showing a control sequence for a second output buffer by a control circuit in an output buffer circuit according to the fifth embodiment of the present invention.
Figure 9B:
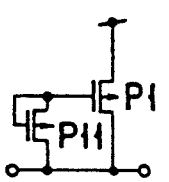
Figure 9C:
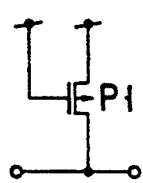

FIGS. 8A, 8B, and 8C, and FIGS. 9A, 9B, and 9C show control sequences to control the gate G1 of the MOS transistor P1 when the p-channel MOS transistor P1 has a current path connected between the power supply Vcc and the output terminal OUT. FIGS. 8A, 8B, and 8C correspond to FIGS. 2F, 2A, and 2B, and FIGS. 9A, 9B, and 9C correspond to FIGS. 3F, 3A, and 3B.

FIG. 10 shows a modified arrangement of the circuit shown in FIG. 1. The control circuit 3 in the circuit shown in FIG. 10 includes CMOS inverter IV3, p-channel MOS transistors P2 to P5, n-channel MOS transistors N2 to N5, a two input NOR gate NR, a two-input NAND gate NA, and a delay circuit DL. The inverter IV2 corresponds to the first output buffer 1, and the p- and n-channel MOS transistors P1 and N1 in the output stage correspond to the second output buffer 2. The control circuit 3 controls the gate potentials of the MOS transistors P1 and N1 of the second output buffer 2, as shown in FIGS. 2A to 2F.

The input node of the inverter IV1 is connected to the input terminal IN, and its output node is connected to the input node of the inverter IV2. The output node of the inverter IV1 is connected to one input node of each of the NOR gate NR and the NAND gate NA, and to the input node of the delay circuit DL. The output node of the delay circuit DL is connected to the input node of the inverter IV3. The output node of the inverter IV3 is connected to the other input node of each of the NOR gate NR and the NAND gate NA.

The current paths of the p-channel MOS transistors P2 to P4 are connected in series between the power supply Vcc and the output terminal OUT. The current path of the n-channel MOS transistor N is connected between a ground terminal Vss and a connecting point of the current paths of the MOS transistors P2 and P3. The connecting point of the current paths of the MOS transistors P2 and P3 is also connected to the gate G1 of the MOS transistor P1. The current paths of the n-channel MOS transistors N4 to N2 are connected in series between the output terminal OUT and the ground terminal Vss. The current path of the p-channel MOS transistor P5 is connected between the power supply Vcc and the connecting point of the current paths of the MOS transistors N2 and N3. The connecting point of the current paths of the MOS transistors N2 and and is also connected to the gate G2 of the MOS transistor N1. The gates of the MOS transistors P4 and N5 are connected to the output node of the NOR gate NR, and the gates of the MOS transistors N4 and P5 are connected to the output node of the NAND gate NA. The gates of the MOS transistors P2 and N2 are connected to the input terminal IN, and the gates of the MOS transistors P3 and N3 are connected to the output node of the inverter IV1.

Figure 11:
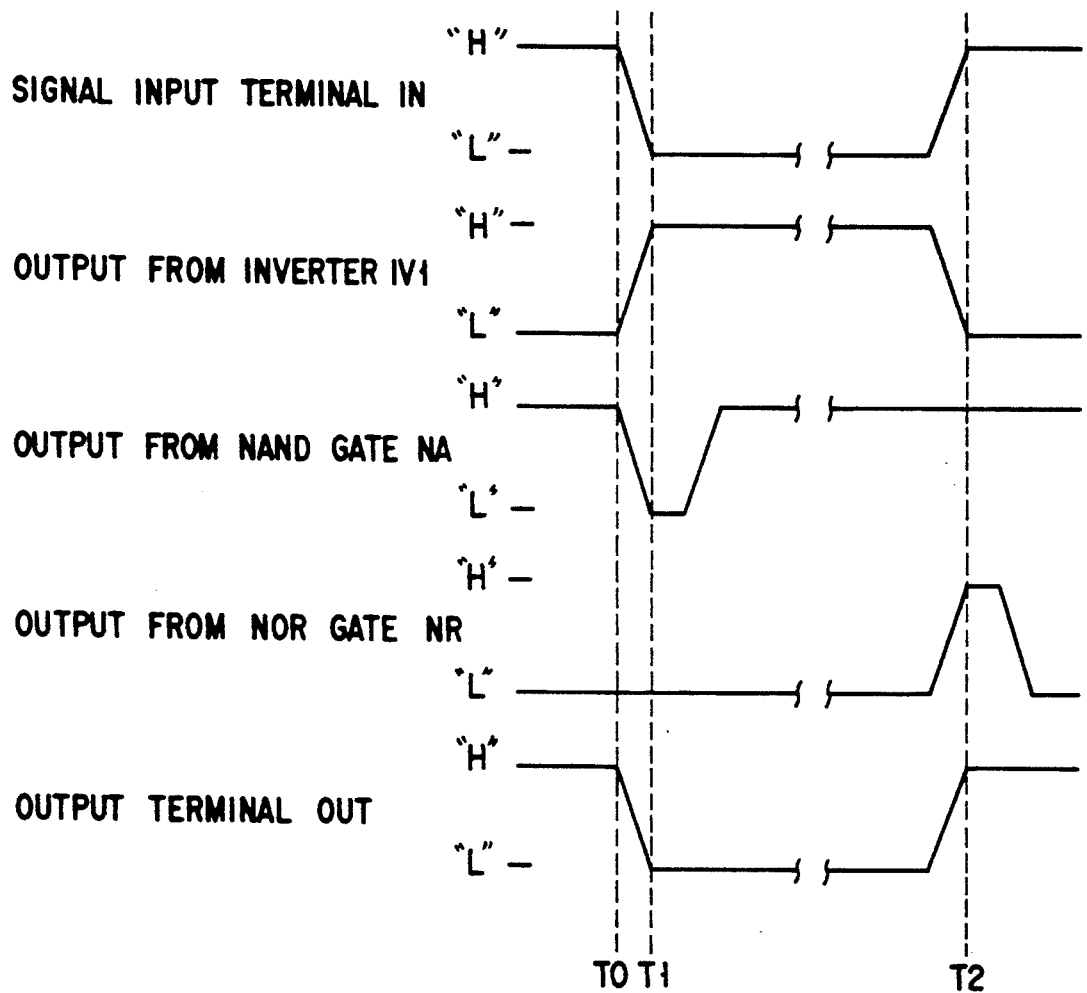
FIG. 11 is a timing chart showing an operation of the circuit shown in FIG. 10.

An operation for changing the output terminal OUT from "H" to "L" level and then to "H" level again, as shown in FIGS. 2A to 2F, in the circuit shown in FIG. 10 will be described with reference to the timing chart of FIG. 11.

When the input terminal IN is stationary at "H" level (before T0), the output node of the inverter IV1 is stationary at "L" level, and the output node (output terminal OUT) of the inverter IV2 is stationary at "H" level. In this state, the MOS transistors P2 and N2 are set in the OFF and ON states, respectively, by the "H"-level potential of the input terminal IN. The MOS transistors P3 and N3 are set in the ON and OFF states, respectively, by the "L"-level output of the inverter IV1. At this time, the MOS transistors P4 and N5 are set in the ON and OFF states, respectively, by the "L"-level output of the NOR gate NR, and the MOS transistors N4 and P5 are set in the ON and OFF states, respectively, by the "H"-level output of the NAND gate NA. As a result, the MOS transistors P1 and N1 of the output buffer 2 are set in the states as shown in FIG. 2A.

When the input terminal IN is changed from "H" to "L" level (T1), the output node of the inverter IV1 is inverted to "H" level, the output terminal OUT is inverted to "L" level, and the output from the NAND gate NA is inverted to "L" level, while the output level of the NOR gate NR stays "L" level. Thus, the MOS transistors P2 and P3 are inverted to the ON and OFF states, respectively, and the gate G1 of the MOS transistor P1 is connected to the power supply Vcc, as shown in FIG. 2B. The MOS transistor P5 is inverted to the ON state, the MOS transistors N2 and N4 are inverted to the OFF state, and the gate G2 of the MOS transistor N1 is connected to the power supply Vcc, as shown in FIG. 2C.

When a delay time set by the delay circuit DL has elapsed, the outputs from the inverter IV3 and the NAND gate NA are inverted to "L" and "H" levels, respectively. Thus, the MOS transistors N4 and P5 are inverted to the ON and OFF states, respectively, and the MOS transistors P1 and N1 of the output buffer 2 are set in the states as shown in FIG. 2D.

When the input terminal IN is changed from "L" to "H" level (T2), the output node of the inverter IV1 is inverted to "L" level, the output terminal OUT is inverter to "H" level, and the output from the NOR gate NR is inverted to "H" level, while the output level of the NAND gate NA stays "H" level. Thus, the MOS transistors N2 and N3 are inverted to the ON and OFF states, respectively, and the gate G2 of the MOS transistor N1 is connected to the ground terminal Vss, as shown in FIG. 2E. The MOS transistor N5 is inverted to the ON state, the MOS transistors P2 and P4 are inverted to the OFF state, and the gate G1 of the MOS transistor P1 is connected to the ground terminal Vss, as shown in FIG. 2F.

When a delay time set by the delay circuit DL has elapsed, the outputs from the inverter IV3 and the NOR gate NR are inverted to "H" and "L" levels, respectively, the MOS transistors P4 and N5 are inverted to the ON and OFF states, respectively, and the MOS transistors P1 and N1 of the output buffer 2 are set in the states as shown in FIG. 2A.

FIGS. 12 to 16 show modifications of the circuit shown in FIG. 10. These circuits basically perform the same operation as that of the circuit shown in FIG. 10.

The circuit shown in FIG. 12 has a delay circuit DL$a$ and an inverter IV3$a$ for the NAND gate NA and a delay circuit DL$b$ and an inverter IV3$b$ for the NOR gate NR, so that the timings at which the MOS transistors N5 and P5 are turned on differ from each other. With this arrangement, the optimum timings at which the MOS transistors N5 and P5 are turned on can be freely set by adjusting the delay times of the two delay circuits DL$a$ and DL$b$.

Figure 13:
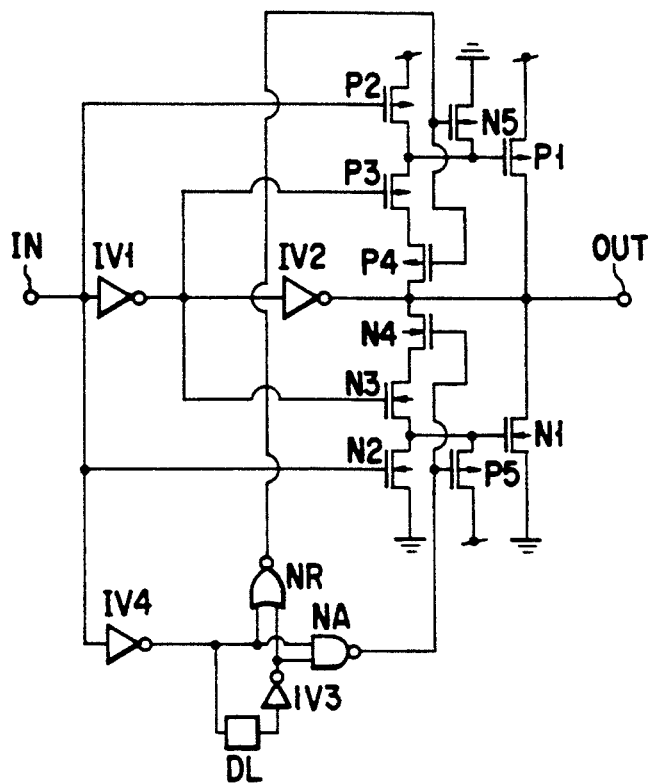

The circuit shown in FIG. 13 is obtained by adding a CMOS inverter IV4 to the circuit shown in FIG. 10. The input node of the CMOS inverter IV4 is connected to the input terminal IN, and its output node is connected to the input nodes of the NOR gate NR, the NAND gate NA, and the delay circuit DL. This circuit is different from the circuit of FIG. 10 in that the output from the CMOS inverter IV4 is supplied to the input nodes of the NOR gate NR, the NAND gate NA, and the delay circuit DL, in place of the output from the CMOS inverter IV1, and performs substantially the same operation as that of FIG. 10.

Figure 14:
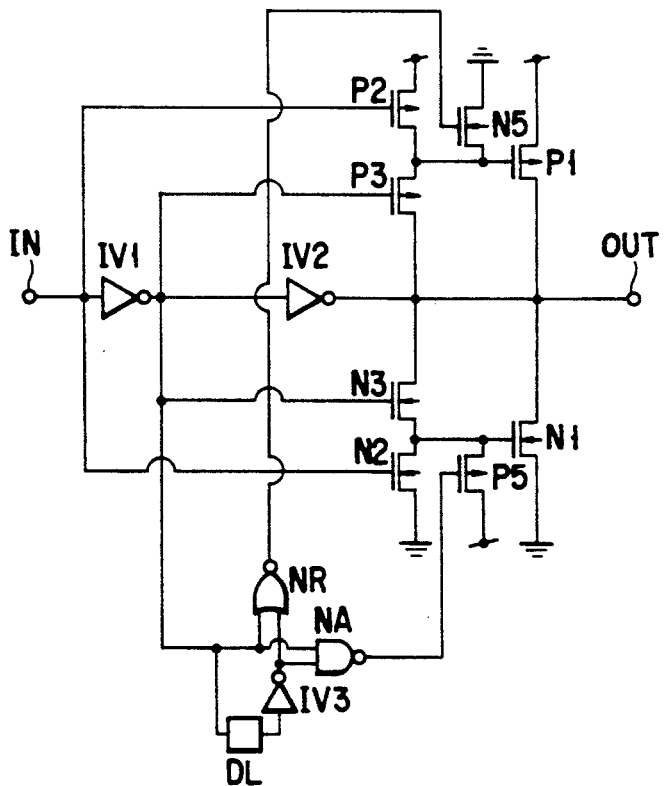

The circuit of FIG. 14 is different from that of FIG. 10 in that the MOS transistors P4 and N4 are omitted. In the circuit shown in FIG. 10, the MOS transistors P4 and N4 serve to reliably prevent a DC through current from flowing between the power supply Vcc and the ground terminal Vss (this occurs when the operation timings of the MOS transistors P2, P3, N3, and N2 are shifted because of some reason and are set in the ON state simultaneously, and hardly occur as far as the normal operation is performed). The circuit shown in FIG. 14 is suitable when circuit simplification and pattern area reduction have priority over generation of the through current. An operation for controlling the gates of the MOS transistors P1 and N1 in the output buffer is substantially the same as in the circuit shown in FIG. 10.

In the circuit shown in FIG. 15, the position where the current path of the MOS transistor P5 is inserted in the circuit shown in FIG. 10 is changed to one between the gate of the MOS transistor N1 and the input node of the inverter IV2. The position where the current path of the MOS transistor N5 is inserted is changed to one between the gate of the MOS transistor P1 and the input node of the inverter IV2. With this arrangement, when the output from the inverter IV1 is set at "H" level, the source of the MOS transistor P5 is connected to the power supply Vcc through the current path of the load MOS transistor in the inverter IV1. On the other hand, when the output from the inverter IV1 is set at "L" level, the source of the MOS transistor N5 is connected to the ground terminal Vss through the current path of the drive MOS transistor in the inverter IV1. As a result, the MOS transistors P5 and N5 respectively perform the same operations as those of the arrangement shown in FIG. 10.

In the circuit of FIG. 16, the MOS transistors P4 and N4 of the circuit shown in FIG. 15 are omitted. The circuit shown in FIG. 16 is suitable when circuit simplification and pattern area reduction have priority over generation of the through current, as the circuit shown in FIG. 14. An operation for controlling the gates of the MOS transistors P1 and N1 in the output buffer 2 is substantially the same as in the circuit shown in FIG. 10.

Figure 17:
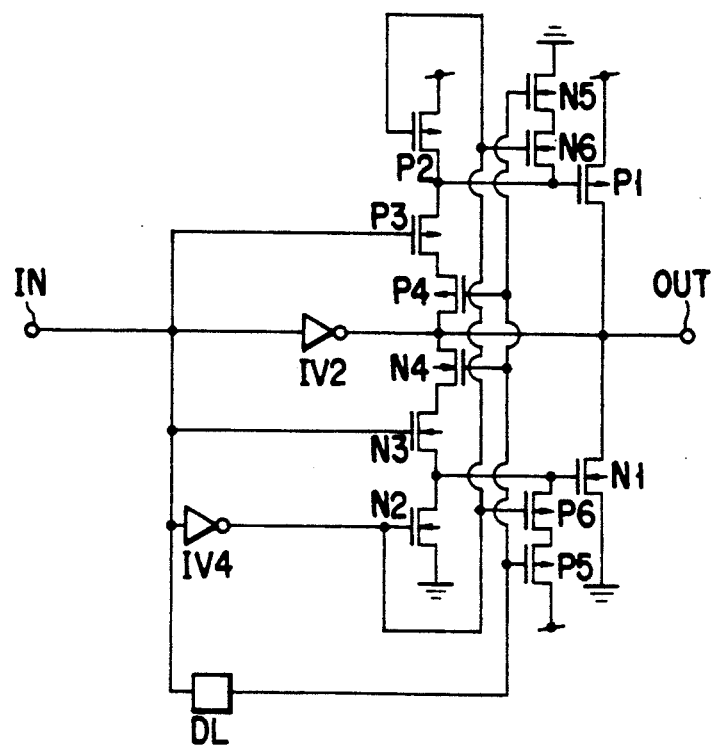

FIG. 17 shows another arrangement of the circuit shown in FIG. 1 in detail. This circuit controls the gates of the MOS transistors P1 and N1 of the output buffer 2 as shown in FIGS. 2A to 2F, in the same manner as in the circuit shown in FIG. 10. In the circuit shown in FIG. 17, the inverters IV1 and IV3, the NOR gate NR, and the NAND gate NA in FIG. 10 are omitted, and a CMOS inverter IV4, and p- and n-channel MOS transistors P6 and N6 are added. That is, the input nodes of the inverter IV4 and the delay circuit DL are connected to the input terminal IN, and the current paths of the MOS transistors P5 and P6 are connected in series between the power supply Vcc and the gate of the MOS transistor N1. Also, the current paths of the MOS transistors N5 and N6 are connected in series between the ground terminal Vss and the gate of the MOS transistor P1. The output node of the inverter IV4 is connected to the gates of the MOS transistors P2, P6, N2, and N6, and the output node of the delay circuit DL is connected to the gates of the MOS transistors P4, P5, N4, and N5.

A control operation for changing the output terminal OUT from "H" to "L" level and then to "H" level again, as shown in FIGS. 2A to 2F, in the circuit shown in FIG. 17 will be described.

When the input terminal IN is stationary at "L" level, the output node (output terminal OUT) of the inverter IV2 and the output node of the inverter IV4 are stationary at "H" level. In this state, the MOS transistors P2 and P6 are set in the OFF state, and the MOS transistors N2 and N6 are set in the ON state by the "H"-level output from the inverter IV4. The MOS transistors P3 and N3 are set in the ON and OFF states, respectively, by the "L"-level potential of the input terminal IN. The MOS transistors P4 and P5 are set in the ON state, and the MOS transistors N4 and N5 are set in the OFF state by the "L"-level output of the delay circuit DL. As a result, the gates of the MOS transistors P1 and N1 of the output buffer 2 are set in the states as shown in FIG. 2A.

When the input terminal IN is changed from "L" to "H" level, the output node (output terminal OUT) of the inverter IV2 and the output node of the inverter IV4 are inverted to "L" level. Thus, the MOS transistors P2 and P6 are inverted to the ON state, and the MOS transistors N2 and N6 are inverted to the OFF state by the "L"-level output from the inverter IV4. At this time, before a delay time set by the delay circuit DL elapses, the output from the delay circuit DL stays at "L" level, the MOS transistors P4 and P5 stay in the ON state, and the MOS transistors N4 and N5 stay in the OFF state. Therefore, the gates of the MOS transistors P1 and N2 are set in the states as shown in FIG. 2C. When the delay time set by the delay circuit DL has elapsed, the output from the delay circuit DL becomes "H" levels, the MOS transistors P4 and P5 are inverted to the OFF state, and the MOS transistors N4 and N5 are inverted to the ON state, as shown in FIG. 2D.

When the input terminal IN is changed from "H" to "L" level, the output nodes of the inverter IV2 and the inverter IV4 are inverted to "H" level. Thus, the MOS transistors P2 and P6 are inverted to the OFF states and the MOS transistors N2 and N6 are inverted to the ON state by the "H"-level output from the inverter IV4. The MOS transistors P3 and N3 are inverted to the ON and OFF states, respectively, by the "L"-level potential of the input terminal IN. At this time, before the delay time set by the delay circuit DL elapses, the output from the delay circuit DL stays at "H" level, the MOS transistors P4 and P5 stay in the OFF state, the MOS transistors N4 and N5 stay in the ON state, and the gates of the MOS transistors P1 and N1 are set in the states as shown in FIG. 2F.

When the delay time set by the delay circuit DL has elapsed, the output from the delay circuit DL becomes "L" level, the MOS transistors P4 and P5 are inverted to the ON state, the MOS transistors N4 and N5 are inverted to the OFF state, and the gates of the MOS transistors P1 and N1 are set in the states as shown in FIG. 2A.

Figure 18:
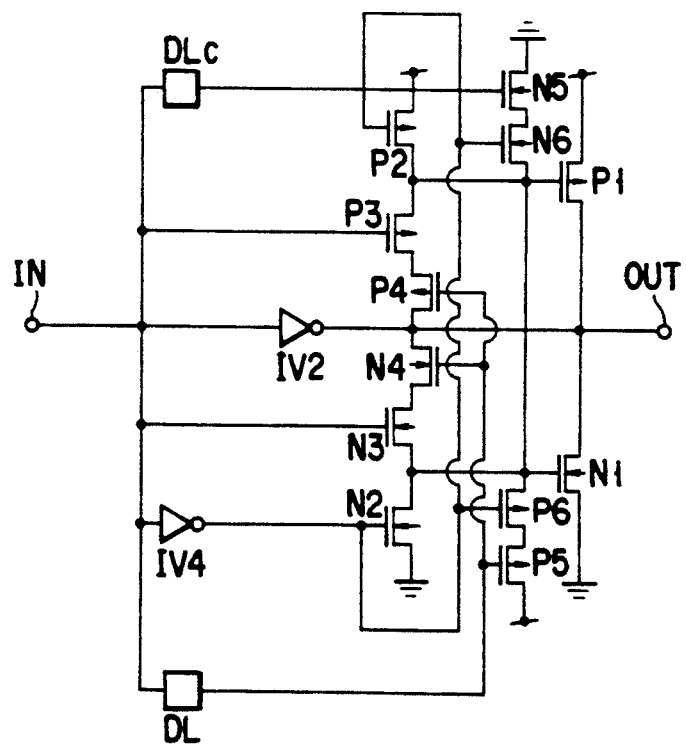

FIG. 18 shows a modification of the circuit shown in FIG. 17. In this circuit, a delay circuit DLc is additionally provided to control the gate of the MOS transistor N5 by its output. Accordingly, the timings at which the MOS transistors N5 and P5 are turned on can be freely adjusted as required by adjusting the delay times of the two delay circuits DL and DLc.

FIGS. 19 to 22 show other modifications of the circuit shown in FIG. 17. The operations of the circuits in FIGS. 19 to 22 are substantially the same as that shown in FIG. 17 described above.

The circuit shown in FIG. 19 is obtained by adding CMOS inverters IV5 and IV6 to the circuit of FIG. 17. The input node of the inverter IV5 is connected to the input terminal IN and its output node is connected to the input node of the inverter IV2. The input node of the inverter IV6 is connected to the input terminal IN, and its output node is connected to the input nodes of the inverter IV4 and the delay circuit DL. This arrangement performs basically the same operation as the circuit shown in FIG. 17 to obtain substantially the same effect.

The circuit shown in FIG. 20 is obtained by omitting the MOS transistors P4 and N4 from the circuit in FIG. 17. In the circuit shown in FIG. 17, the MOS transistors P4 and N4 serve to reliably prevent the DC through current from flowing between the power supply Vcc and the ground terminal Vss. The circuit shown in FIG. 20 is suitable when circuit simplification and pattern area reduction have priority over generation of the through current. The operation for controlling the gates of the MOS transistors P1 and N is substantially the same as that in the circuit shown in FIG. 17.

In the circuit shown in FIG. 21, the position where the MOS transistors P5 and P6 having current paths connected in series to each other are inserted in the circuit shown in FIG. 17 is changed to that between the gate of the MOS transistor N1 and the input terminal IN, and the position where the MOS transistors N5 and N6 having current paths connected in series to each other are inserted in the circuit shown in FIG. 17 is changed to that between the gate of the MOS transistor P1 and the input terminal IN. The circuit having this arrangement performs basically the same operation as that shown in FIG. 17 to provide substantially the same effect.

The circuit shown in FIG. 22 is obtained by omitted the MOS transistors P4 and N4 from the circuit shown in FIG. 21. The circuit shown in FIG. 22 is suitable when circuit simplification and pattern area reduction have priority over generation of the through current, like the circuit shown in FIG. 20. The operation for controlling the gates of the MOS transistors P1 and N1 is substantially the same as that of the circuit shown in FIG. 17.

In the circuits of FIGS. 10 and 12 to 22, the circuit state of FIG. 2C or 2F is set during a predetermined period of time in accordance with a change in input signal. In this case, in the circuits in FIGS. 15, 16, 21, and 22, the gate potentials of the MOS transistors P1 and N1 are obtained from the input level of the first output buffer (inverter IV2).

FIGS. 23 to 26 show modifications in which the level of the output terminal OUT is discriminated to perform switching between the states of FIGS. 2C and 2D and switching between the states of FIGS. 2F and 2A.

The circuit shown in FIG. 23 is obtained by omitting the inverter IV3, the NOR gate NR, the NAND gate NA, and the delay circuit DL from the circuit shown in FIG. 15 and adding a CMOS inverter IV5 and a CMOS inverter IV6 having a threshold voltage lower than that of the inverter IV5. The input node of the inverter IV5 is connected to the output terminal OUT and its output node is connected to the gates of the MOS transistors P4 and N5. The input node of the inverter IV6 is connected to the output terminal OUT and its output node is connected to the gates of the MOS transistors N4 and P5. With this arrangement, the level of the output terminal OUT is discriminated to perform switching between the states of FIGS. 2C and 2D and switching between the states of FIGS. 2F and 2A.

The circuit shown in FIG. 24 is obtained by omitting the inverter IV5 from the circuit shown in FIG. 23 and connecting the output node of the inverter IV6 to the gates of the MOS transistors P4 and N5. This arrangement performs basically the same operation as that of the circuit shown in FIG. 23 to provide substantially the same effect.

Figure 25:
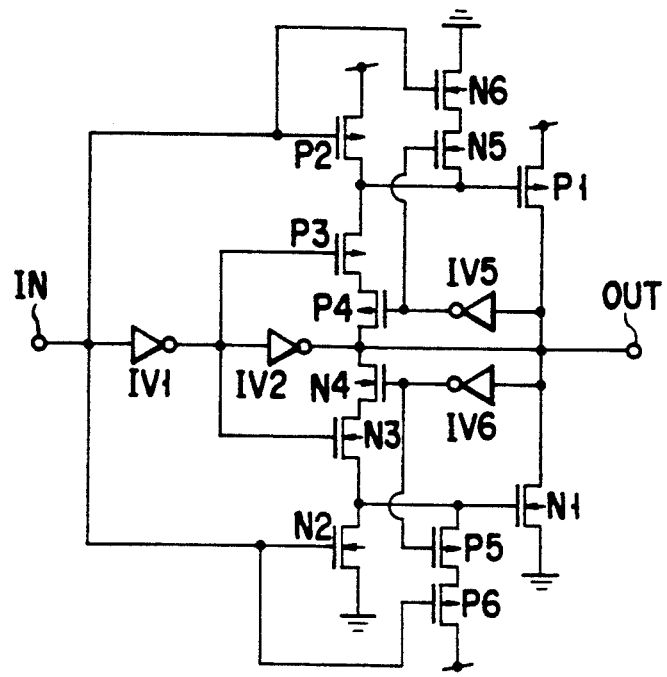

The circuit shown in FIG. 25 is obtained by adding MOS transistors P6 and N6 to the circuit shown in FIG. 23 and changing positions to insert the MOS transistors P5 and N5. The current paths of the MOS transistors P5 and P6 are connected in series between the power supply Vcc and the gate of the MOS transistor N1, and the current paths of the MOS transistors N5 and N6 are connected in series between the gate of the MOS transistor P1 and the ground terminal Vss. The gates of the MOS transistors P6 and N6 are connected to the input terminal IN. Excluding that, the arrangement in FIG. 25 is the same as that shown in FIG. 23 to perform substantially the same operation as that of the circuit shown in FIG. 23.

Figure 26:
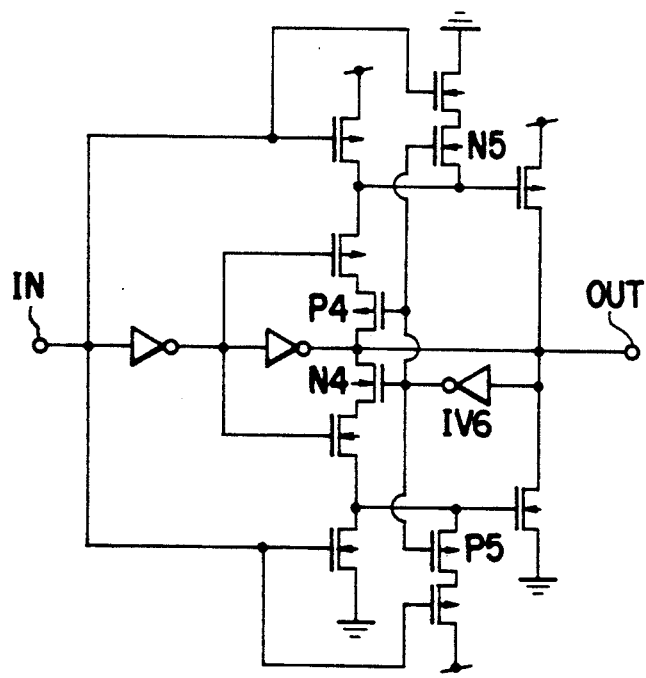

The circuit shown in FIG. 26 is obtained by omitting the inverter IV5 of the circuit shown in FIG. 25 and connecting the output node of the inverter IV6 to the gates of the MOS transistors P4 and M5. Even this arrangement performs basically the same operation as that of the circuit shown in FIG. 25 to provide substantially the same effect.

Figure 27:
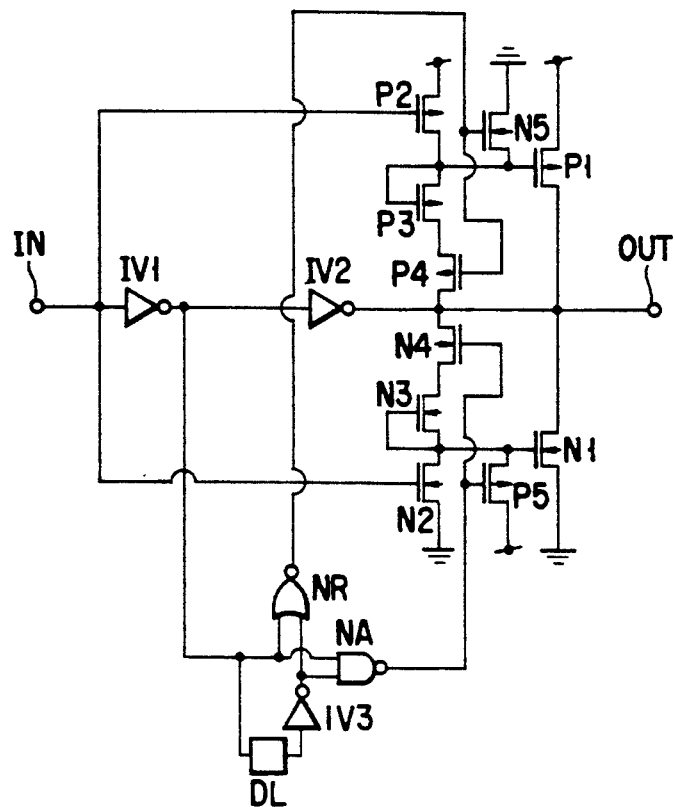
FIG. 27 is a circuit diagram of another arrangement of an output buffer circuit having a control circuit which performs control in accordance with the sequence shown in FIGS. 3A to 3L on the basis of a change in input signal.
Figure 28:
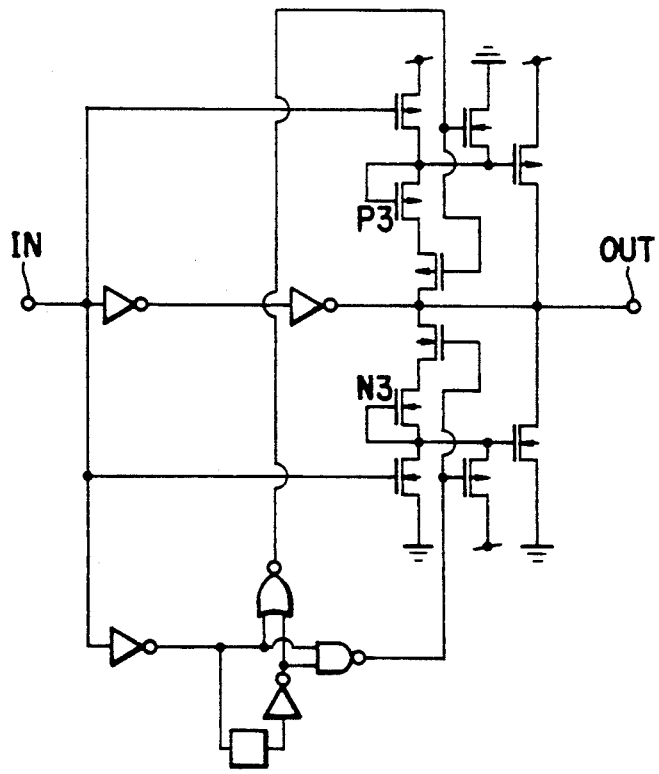
Figure 29:
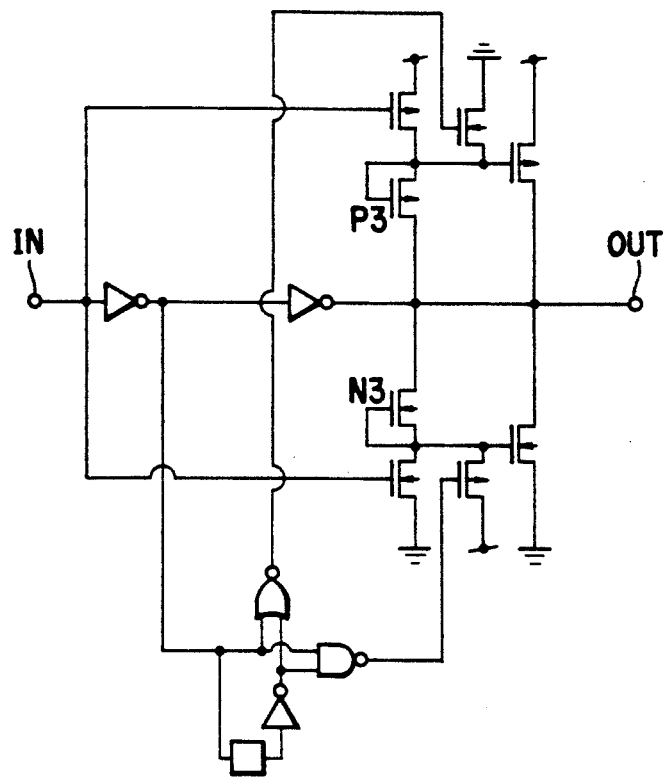
Figure 30:
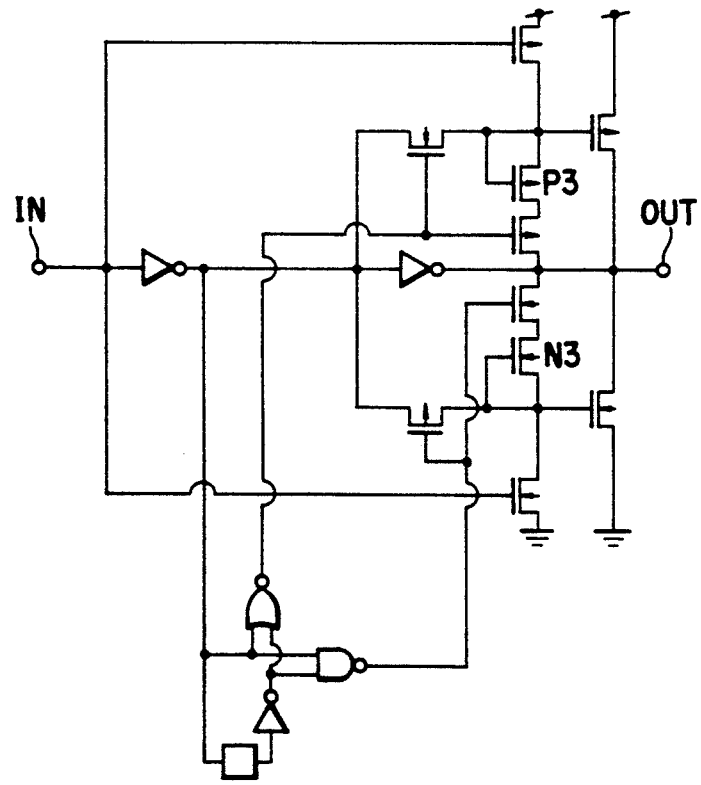
Figure 33:
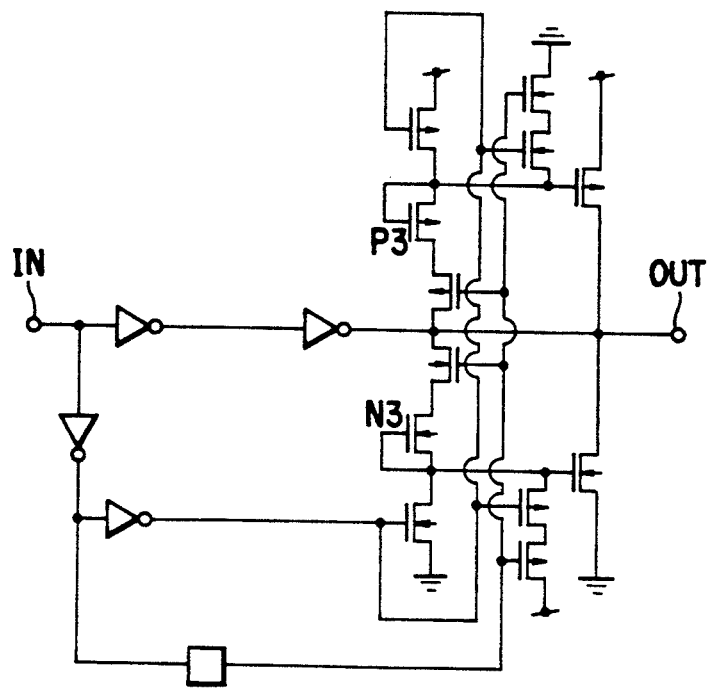
FIG. 33 is a circuit diagram showing a modification of the circuit shown in FIG. 32.
Figure 34:
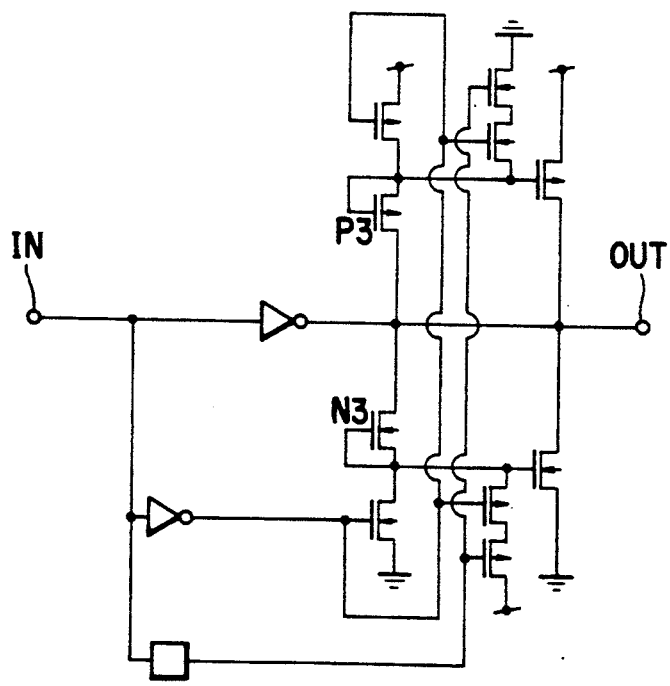

FIG. 27 shows still another arrangement of the circuit shown in FIG. 1 in detail. This circuit controls the gates of the MOS transistors P1 and N1 of the output buffer 2 as indicated in FIGS. 3A to 3F. While the gate of the MOS transistor P3 in the circuit is connected to the input node of the inverter IV2 in FIG. 10, it is connected to the source of the MOS transistor P3 in FIG. 27, and while the gate of the MOS transistor N3 is connected to the input node of the inverter IV2 in FIG. 10, it is connected to the source of the MOS transistor N3 in FIG. 27.

The operation of the circuit of FIG. 27 basically sets the circuit state of FIG. 3C or 3F during a predetermined period of time in accordance with the change in input signal, in the same manner as the circuit of FIG. 10. As described above with reference to FIGS. 3A and 3D, when the level of the output terminal OUT is changed, the drive power of the MOS transistor P1 or N1 can be prolonged by the operation of the p-channel MOS transistor P3 having the source and gate connected to each other or by the operation of the n-channel MOS transistor N3 having the gate and source connected to each other.

FIGS. 28 to 31 show modifications of the circuit shown in FIG. 27. The operations of these circuits are substantially the same as that of the circuit shown in FIG. 27. In each of the circuits shown in FIGS. 28 to 31, while the gate of the MOS transistor P3 is connected to the input node in each of the circuits shown in FIGS. 13 to 16, it is connected to the source of the MOS transistor P3, and while the gate of the MOS transistor N3 is connected to the input node of the inverter IV2 in each of the circuits shown in FIGS. 13 to 16, it is connected to the source of the MOS transistor N3.

FIG. 32 shows another modification of the circuit shown in FIG. 27. In FIG. 32, while the gate of the MOS transistor P3 is connected to the input node of the inverter IV2 in FIG. 17, it is connected to the source of the MOS transistor P3, and while the gate of the MOS transistor N3 is connected to the input node of the inverter IV2 in FIG. 17, it is connected to the source of the MOS transistor N3.

FIGS. 33 to 36 show modifications of the circuit shown in FIG. 32. In FIGS. 33 to 36, while the gate of the MOS transistor P3 is connected to the input node of the inverter IV2 in FIGS. 19 to 22, it is connected to the source of the MOS transistor P3, and while the gate of the MOS transistor N3 is connected to the input node of the inverter IV2 in FIGS. 18 to 22, it is connected to the source of the MOS transistor N3.

Each of the circuits of the FIGS. 27 to 26 is set in the circuit state shown in FIG. 3C or 3F during a predetermined period of time in accordance with a change in input signal. At this time, in order to form the circuit states of FIGS. 3C and 3F, each of the circuits of FIGS. 30, 31, 35, and 36 obtains the gate potentials of the MOS transistors P1 and N1 from the input level of the first output buffer (inverter IV2).

FIGS. 37 to 40 show still other modifications of the circuit shown in FIG. 27 in order to perform switching between the circuit states of FIGS. 3C and 3D and switching between the circuit states of FIGS. 3F and 3F by discriminating the level of the output terminal OUT. In FIGS. 37 to 40, while the gate of the MOS transistor P3 is connected to the input node of the inverter IV2 in FIGS. 23 to 26, it is connected to the source of the MOS transistor P3, and while the gate of the MOS transistor N3 is connected to the input node of the inverter IV2 in FIGS. 23 to 26, it is connected to the source of the MOS transistor N3. Excluding that, the circuit arrangement of each of FIGS. 37 to 40 is the same as that of each of FIGS. 23 to 26.

FIG. 41 shows still another arrangement of the circuit shown in FIG. 1 in detail. This circuit controls the gates of the MOS transistors P1 and N1 of the output buffer 2 as indicated in FIGS. 4A to 4D. In the circuit of FIG. 41, the position where the current path of the MOS transistor P5 is inserted in the circuit shown in FIG. 10 is changed to that between the gate of the MOS transistor N1 and the output terminal OUT, and the position where the current path of the MOS transistor N5 is inserted in the circuit shown in FIG. 10 is changed to that between the gate of the MOS transistor P1 and the output terminal OUT. Excluding that, the arrangement of FIG. 41 is the same as that of the circuit shown in FIG. 10.

FIGS. 42 to 46 show modifications of the circuit shown in FIG. 41. Even the arrangement shown in each of FIGS. 42 to 46 basically performs the same operation as that of the circuit of FIG. 41 to obtain substantially the same effect.

The circuit shown in FIG. 42 is obtained by omitting the MOS transistors P4 and N4 from the circuit in FIG. 41.

In FIG. 43, the position where the MOS transistors P5 and P6 having current paths connected in series to each other are inserted is changed to that between the gate of the MOS transistor N1 and the output terminal OUT, and the position where the MOS transistors N5 and N6 having current paths connected in series to each other are inserted is changed to that between the gate of the MOS transistor P1 and the output terminal OUT.

The circuit shown in FIG. 44 is obtained by omitting the MOS transistors P4 and N4 from the circuit shown in FIG. 43.

The circuit shown in FIG. 45 is obtained by omitting the inverter IV3, the NOR gate NR, the NAND gate NA, and the delay gate DL from the circuit shown in FIG. 43, and connecting the gates of the MOS transistors P5 and N5 to the input terminal IN.

The circuit shown in FIG. 46 is obtained by omitting the inverter IV1 from the circuit shown in FIG. 45 and connecting the input node of the inverter IV4 to the input terminal IN and its output node to the gates of the MOS transistors P2, P5, N2, and N5. The input node of the inverter IV2 is connected to the input terminal IN.

FIG. 47 shows still anther arrangement of the circuit shown in FIG. 1 in detail. This circuit controls the gates of the MOS transistors P1 and N1 of the output buffer 2 as indicated in FIGS. 5A to 5F. In FIG. 47, the position where the MOS transistor P5 is inserted in FIG. 27 is changed to that between the gate of the MOS transistor N1 and the output terminal OUT, and the position where the MOS transistor N5 is inserted in FIG. 27 is changed to that between the gate of the MOS transistor P1 and the output terminal OUT.

FIGS. 48 to 52 show modifications of the circuit shown in FIG. 47. Even this arrangement can perform basically the same operations as the circuit of FIG. 47 to provide substantially the same effect.

The circuit shown in FIG. 48 is obtained by omitting the MOS transistors P4 and N4 from the circuit shown in FIG. 47.

Figure 49:
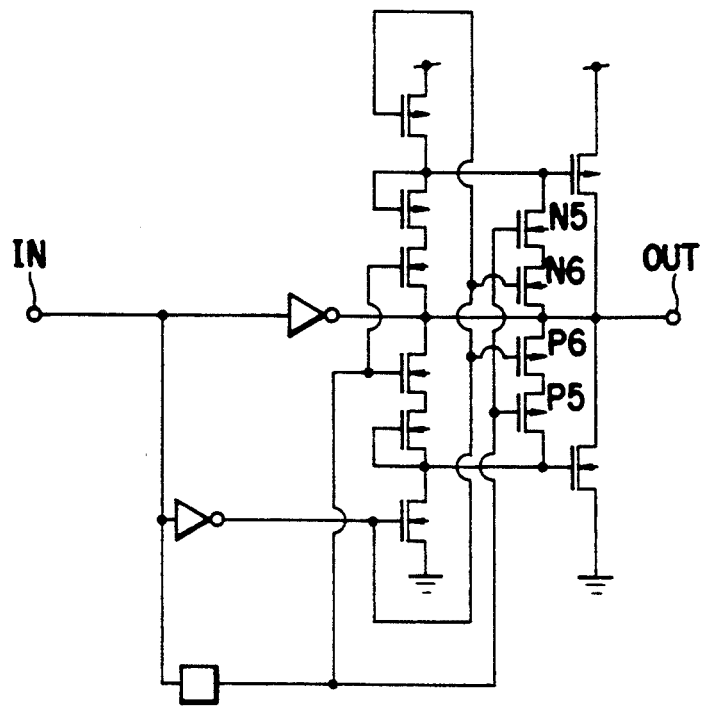

In the circuit shown in FIG. 49, the position where the MOS transistors P5 and P6 having the current paths connected in series in FIG. 32 are inserted is changed to that between the gate of the MOS transistor N1 and the output terminal OUT, and the position where the MOS transistors N5 and N6 having the current paths connected in series in FIG. 32 are inserted is changed to that between the gate of the MOS transistor P1 and the output terminal OUT.

Figure 50:
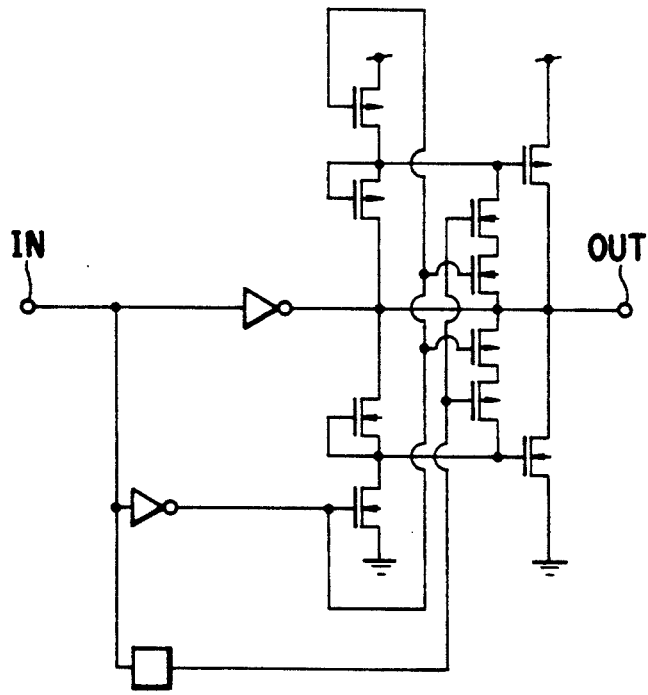

The circuit shown in FIG. 50 is obtained by omitting the MOS transistors P4 and N4 from the circuit shown in FIG. 49.

Figure 51:
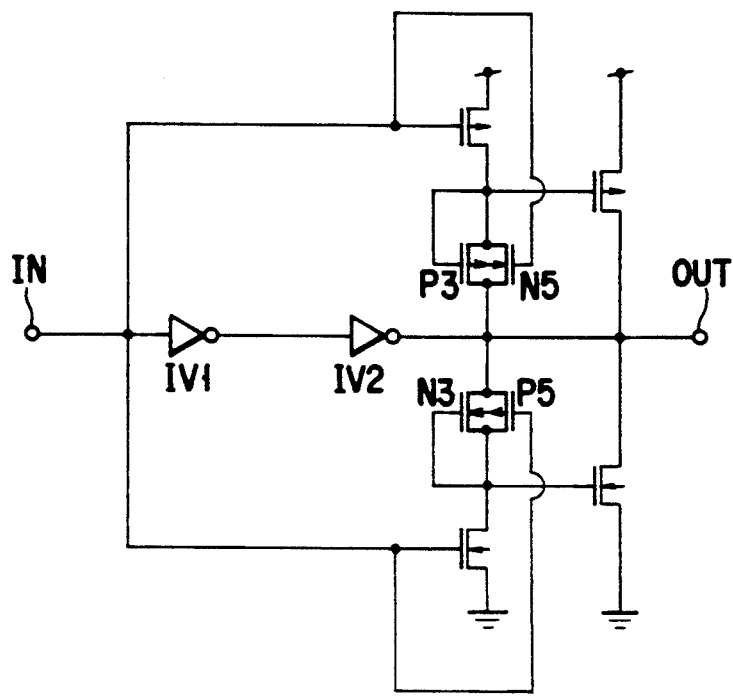

In the circuit shown in FIG. 51, the inverter IV3, the NOR gate NR, the NAND gate NA, and the delay circuit DL of the circuit shown in FIG. 48 are omitted, and the gates of the MOS transistors P5 and N5 are connected to the input terminal IN.

Figure 52:
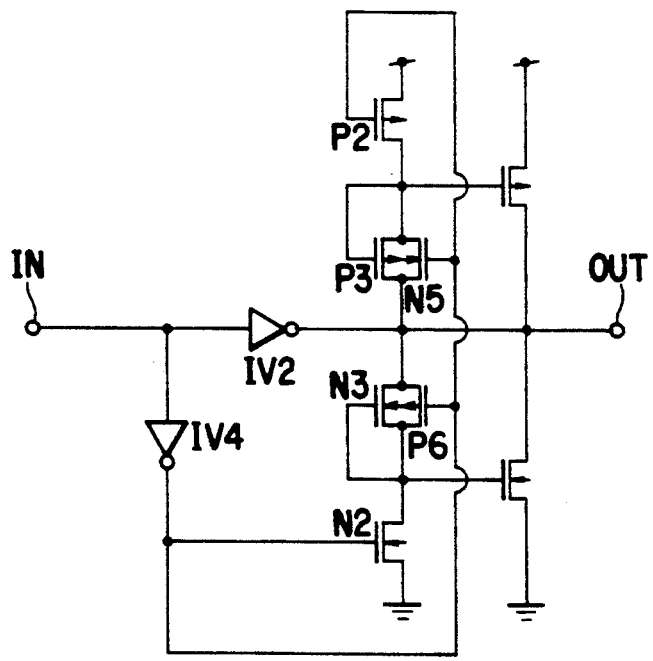

The circuit shown in FIG. 52 is obtained by omitting the inverter IV1 from the circuit shown in FIG. 51 and adding a CMOS inverter IV4. The input node of the inverter IV4 is connected to the input terminal IN and its output node is connected to the gates of the MOS transistors P2 P5, N2, and N5. The input node of the inverter IV2 is connected to the input terminal IN.

In the embodiments, arrangements, and modifications described above, the output buffers 1 and 2 and the control circuit 3 comprise MOSFETs. However, a bipolar transistor can be used as the output buffer 2. More specifically, pnp and npn transistors Q1 and Q2 can be arranged in place of the MOS transistors P1 and N1, as shown in FIG. 53 The emitter of the pnp transistor Q1 is connected to the power supply Vcc, its collector is connected to the output terminal OUT, and its base is connected to the first control signal output node of the control circuit 3. The collector of the npn transistor Q2 is connected to the output terminal OUT, its emitter is connected to the ground terminal Vss, and its base is connected to the second control signal output node of the control circuit 3.

The present invention can similarly be applied to a buffer circuit in which the emitter of the pnp transistor Q1 is connected to the power supply Vcc, its collector is connected to the output terminal OUT, and its base is connected to a control signal output node of the control circuit 3, as shown in FIG. 54, or to a circuit in which the collector of the npn transistor Q2 is connected to the output terminal OUT, its emitter is connected to the ground terminal Vss and its base is connected to a control signal output node of the control circuit 3, as shown in FIG. 55.

As has been described above, according to the present invention, there is provided an output buffer circuit which has an output resistance automatically determined from AC specifications when an output is changed and a high output resistance determined only from DC specifications when the output is stationary, in which a variation in a power supply potential or a ground potential when the output is changed does not easily adversely affect an output node, and which can suppress output noise.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. An output buffer circuit comprising:
a first output buffer having an input node to which an input signal is supplied, an output node and an output resistance determined from DC specifications;
a second output buffer having an output node connected to said output node of said first output buffer and an output resistance which satisfies AC specifications when said second output buffer is driven with said first output buffer; and
control means for controlling an operation of said second output buffer, said control means driving said second output buffer when at least one of an output of said first output buffer and said input signal changes and setting said output node of said second output buffer in a high impedance state when said output of said first output buffer is stationary, said control means connecting said output node of said first output buffer to an input of said second output buffer through drain-source paths of transistors.

2. A circuit according to claim 1, wherein said first output buffer includes a CMOS inverter.

3. A circuit according to claim 1, wherein said second output buffer includes a MOSFET.

4. A circuit according to claim 1, wherein said second output buffer includes a bipolar transistor.

5. A circuit according to claim 1, wherein said control means controls the operation of said second output buffer in response to a level change in input signal.

6. A circuit according to claim 1, wherein said control means controls the operation of said second output buffer in response to a level change of said input node of said first output buffer.

7. A circuit according to claim 1, wherein said control means controls the operation of said second output buffer in response to a level change of said output node of said first output buffer.

8. An output buffer circuit comprising:
a first inverter having an input node to which an input signal is supplied and an output node;
a first output buffer having an input node connected to said output node of said first inverter, an output node and an output resistance determined from DC specifications;
a second output buffer having an output node connected to said output node of said first output buffer and an output resistance which satisfies AC specifications when said second output buffer is driven with said first output buffer; and
control means for controlling an operation of said second output buffer, said control means driving said second output buffer when said input signal changes and setting said output node of said second output buffer in a high impedance state when an output from said first output buffer is stationary, said control means connecting said output node of said first output buffer to an input of said second output buffer through drain-source paths of transistors.

9. A circuit according to claim 1 or 8, wherein said second output buffer has a current-source transistor connected between a high-potential power supply and said output node of said first output buffer, and said control means includes first setting means for temporarily setting said current-source transistor in an ON state when said output ode of said first output buffer changes from a first logic level to a second logic level, first connecting means for connecting a control electrode of said current-source transistor to said output node of said first output buffer when said output node of said first output buffer is stationary at said second logic level, and second connecting means for connecting said control electrode of said control electrode of said current-source transistor to said high-potential power supply when said output node of said first output buffer changes from said second logic level to said first logic level.

10. A circuit according to claim 9, wherein said current-source transistor is a p-channel MOS transistor.

11. A circuit according to claim 9, wherein said current-source transistor is a pnp bipolar transistor.

12. A circuit according to claim 1 or 8, wherein said second output buffer has a current-sink transistor connected between said output node of said first output buffer and a low-potential power supply, and said control means includes first setting means for temporarily setting said current-sink transistor in an ON state when said output node of said first output buffer changes from a first logic level to a second logic level, first connecting means for connecting a control electrode of said current-sink transistor to said output node of said first output buffer when said output node of said first output buffer is stationary at said second logic level, and second connecting means for connecting said control electrode of said current-sink transistor to said low-potential power supply when said output node of said first output buffer changes form said second logic level to said first logic level.

13. A circuit according to claim 12, wherein said current-sink transistor is an n-channel MOS transistor.

14. A circuit according to claim 12, wherein said current-sink transistor is an npn bipolar transistor.

15. A circuit according to claim 1 or 8, wherein said second output buffer has a current-source transistor connected between a high-potential power supply and said output node of said first output buffer, and has a current-sink transistor connected between said output node of said first output buffer and a low-potential power supply, and said control means includes first setting means for temporarily setting said current-source transistor in an ON state and connecting a control electrode of said current-sink transistor to said low-potential power supply when said output node of said first output buffer changes from a first logic level to a second logic level, first connecting means for connecting a control electrode of said current-source transistor to said output node of said first output buffer when said output node of said first output buffer is stationary at said second logic level, and second setting means for temporarily setting said current-sink transistor in an ON state and connecting said control electrode of said current-source transistor to said high-potential power supply when said output node of said first buffer changes from said second logic level to said first logic level.

16. A circuit according to claim 15, wherein said current-source transistor is a p-channel MOS transistor, and said current-sink transistor is an n-channel MOS transistor.

17. A circuit according to claim 15, wherein said current-source transistor is a pnp bipolar transistor, and said current-sink transistor is an npn bipolar transistor.

18. A circuit according to claim 9, wherein said first means includes switching means for connecting said control electrode of said current-source transistor to either one of a low-potential power supply and said output node of said first output buffer when said current-source transistor is temporariy set in the ON state.

19. A circuit according to claim 12, wherein said first means includes switching means for connecting said control electrode of said current-sink transistor to either one of a high-potential power supply and said output node of said first output buffer when said current-sink transistor is temporarily set in the ON state.

20. A circuit according to claim 9, wherein said control means further comprises a diode means connected between said control electrode of said current-source transistor and said output node of said first output buffer, and said control electrode of said current-source transistor and said output node of said output buffer are connected through said diode means when said output node of said first output buffer is set at "H" level.

21. A circuit according to claim 12, wherein said control means further comprises a diode means connected between said control electrode of said current-sink transistor and said output node of said first output buffer, and said control electrode of said current-sink transistor and said output node of said first output buffer are connected through said diode means when said output node of said first output buffer is set at "L" level.

22. A circuit according to claim 15, wherein said control means further comprises a first diode means connected between said control electrode of said current-source transistor and said output node of said first output buffer and a second diode means connected between said control electrode of said current-sink transistor and said output node of said first output buffer, said control electrode of said current-source transistor and said output node of said first output buffer are connected through said first diode means when said output node of said first output buffer is at "H" level, and said control electrode of said current-sink transistor and said output node of said first output buffer are connected through said second diode means said output node of said first output buffer is set at "L" level.

23. A circuit according to claim 1 or 8, wherein said second output buffer has a current-source transistor connected between a high-potential power supply and said output node of said first output buffer, and said control means includes first switching means connected between said high-potential power supply and a control electrode of a said current-source transistor, second switching means connected between said control electrode of said current-source transistor and said output node of said first output buffer, third switching means connected between said control electrode of said current-source transistor and either one of a low-potential power supply and said output node of said first output buffer, and a control circuit for controlling said first, second, and third switching means in accordance with a predetermined order.

24. A circuit according to claim 1 or 8, wherein said second output buffer has a current-sink transistor connected between said output node of said first output buffer and a low-potential power supply, and said control means includes first switching means connected between a control electrode of a said current-sink transistor and said low-potential power supply, second switching means connected between said control electrode of said current-sink transistor and said output node of said first output buffer, third switching means connected between said control electrode of said current-sink transistor and either one of a high-potential power supply and said output node of said first output buffer, and a control circuit for controlling said first, second, and third switching means in accordance with a predetermined order.

25. An output buffer circuit according to claim 1 or 8, wherein said second output buffer has a current-source transistor connected between a high-potential power supply and said output node of said first output buffer, and has a current-sink transistor connected between said output node of said first output buffer and a low-potential power supply, and said control means includes first means for connecting a control electrode of said current-source transistor to said output node of said first output buffer and connecting a control electrode of said current-sink transistor to said low-potential power supply when said output node of said first output buffer is stationary at a first logic level, second means for connecting said control electrode of said current-source transistor to said high-potential power supply and connecting said control electrode of said current-sink transistor firstly to said low-potential power supply and secondly to said high-potential power supply when said output node of said first output buffer changes from said first logic level to a second logic level, third means for connecting said control electrode of said current-source transistor to said high-potential power supply and connecting said control electrode of said current-sink transistor to said output node of said first output buffer when said output node of said first output buffer is stationary at said second logic level, and fourth means for connecting said control electrode of said current-source transistor firstly to said high-potential power supply and secondly to said low-potential power supply and connecting said control electrode of said current-sink transistor to said low-potential power supply when said output node of said first output buffer changes from aid second logic level to said first logic level.

26. A circuit according to claim 25, wherein said first means includes fifth means for connecting said control electrode of said current-source transistor to said output node of said first output buffer through a current path of a first transistor and connecting a control gate of said first transistor to said control electrode of said current-source transistor; and said third means includes sixth means for connecting said control electrode of said current-sink transistor to said output node of said first output buffer through a current path of a second transistor and connecting a control gate of said second transistor to said control electrode of said current-sink transistor.

* * * * *